(12) United States Patent
Kisakibaru et al.

(10) Patent No.: US 7,416,998 B2
(45) Date of Patent: Aug. 26, 2008

(54) AIR-CURTAIN FORMING APPARATUS FOR WAFER HERMETIC CONTAINER IN SEMICONDUCTOR-FABRICATION EQUIPMENT OF MINIENVIRONMENT SYSTEM

(75) Inventors: Toshirou Kisakibaru, Tokyo (JP); Shigeru Kouchiyama, Tokyo (JP); Makoto Okada, Tokyo (JP); Kouta Ueno, Tokyo (JP)

(73) Assignees: Kondoh Industries, Ltd., Tokyo (JP); Cambridge Filter Japan, Ltd., Tokyo (JP)

( * ) Notice: Subject to any disclaimer, the term of this patent is extended or adjusted under 35 U.S.C. 154(b) by 383 days.

(21) Appl. No.: 10/537,133

(22) PCT Filed: Feb. 27, 2003

(86) PCT No.: PCT/JP03/02218

§ 371 (c)(1),
(2), (4) Date: Jun. 2, 2005

(87) PCT Pub. No.: WO2004/051736

PCT Pub. Date: Jun. 17, 2004

(65) Prior Publication Data

US 2006/0060136 A1    Mar. 23, 2006

(30) Foreign Application Priority Data

Dec. 3, 2002    (JP) ............................. 2002-351024

(51) Int. Cl.
*H01L 21/00*    (2006.01)
*B65B 69/00*    (2006.01)
*B01D 50/00*    (2006.01)

(52) U.S. Cl. .................. 438/800; 206/710; 55/318; 414/411; 141/4

(58) Field of Classification Search .............. 438/800; 117/666; 414/411; 206/710, 711; 55/318; 141/4

See application file for complete search history.

(56) References Cited

U.S. PATENT DOCUMENTS 4,724,874 A    2/1988   Parikh et al. .................. 141/98

(Continued)

FOREIGN PATENT DOCUMENTS

EP    319145    6/1989

(Continued)

OTHER PUBLICATIONS

International Search Report.

(Continued)

*Primary Examiner*—W. David Coleman
(74) *Attorney, Agent, or Firm*—Bromberg & Sunstein LLP

(57) ABSTRACT

In a semiconductor-fabrication equipment of a minienvironment system, ambient air is prevented from entering a gap between an opening of the semiconductor-fabrication equipment and a wafer gateway of a hermetic container to prevent dust entrained in the ambient air from adhering to wafers in the hermetic container. Clean air is injected from a clean-air injection device (1), which is connected to an air-supply device (2) through an air-supply tube (3), and which is provided with filter means (6a) in the from of rectangular frame formed with cylindrically-shaped filters connected to each other, to form an air curtain at the gap (96) between the gateway (74) of the hermetic container (71) through which wafers (73) are taken out of or put in the hermetic container (71) and the opening (98) of a loading part (78) attached to a front panel (77) of the semiconductor-fabrication equipment (76), thereby shutting off the ambient air that would otherwise enter the hermetic container (71) through the gap (96) between the gateway (74) of the hermetic container (71) and the opening (98) of the loading part (78) attached to the semiconductor-fabrication equipment (76) when a lid (75) of the hermetic container (71) is opened into the semiconductor-fabrication equipment (76).

7 Claims, 34 Drawing Sheets

U.S. PATENT DOCUMENTS

| | | | |
|---|---|---|---|
| 4,781,511 A | 11/1988 | Harada et al. | 414/217.1 |
| 4,904,153 A | 2/1990 | Iwasawa et al. | 414/735 |
| 4,927,438 A | 5/1990 | Mears et al. | |
| 4,976,815 A | 12/1990 | Hiratsuka et al. | 156/345.11 |
| 5,145,303 A | 9/1992 | Clarke | 414/217 |
| 5,382,127 A | 1/1995 | Garric et al. | 414/217.1 |
| 5,413,527 A | 5/1995 | Dansui et al. | 454/57 |
| 5,431,600 A | 7/1995 | Murata et al. | 454/187 |
| 5,628,683 A | 5/1997 | Gentischer | 454/187 |
| 5,752,796 A | 5/1998 | Muka | 414/217.1 |
| 5,829,939 A | 11/1998 | Iwai et al. | 414/411 |
| 5,842,917 A | 12/1998 | Soung et al. | 454/187 |
| 6,010,399 A | 1/2000 | Lee et al. | 454/187 |
| 6,221,163 B1 | 4/2001 | Roberson et al. | 118/715 |
| 6,238,283 B1 | 5/2001 | Matsuyama et al. | 454/187 |
| 6,446,646 B1 | 9/2002 | Izumi | 134/66 |
| 6,602,127 B2 | 8/2003 | Heinemann | 454/187 |
| 6,704,998 B1 | 3/2004 | Bonora et al. | 29/700 |
| 6,758,876 B2 | 7/2004 | Suzuki et al. | 55/385.6 |
| 6,790,286 B2 | 9/2004 | Nishimura et al. | 118/712 |
| 6,875,282 B2 | 4/2005 | Tanaka et al. | 118/719 |
| RE39,241 E | 8/2006 | Fosnight | 55/318 |

FOREIGN PATENT DOCUMENTS

| | | |
|---|---|---|
| JP | 60-187839 | 12/1985 |
| JP | 11145245 | 5/1999 |
| JP | 2000/161735 | 6/2000 |
| JP | 182978 A 2 | 7/2001 |
| JP | 2003/007799 | 1/2003 |
| WO | WO 99/33726 | 7/1999 |

OTHER PUBLICATIONS

Office Action dated Dec. 13, 2007 for U.S. Appl. No. 10/513,899.
International Search Report for PCT/JP02/10584 corresponding to national phase entry of U.S. Appl. No. 10/513,899.

AIR-CURTAIN FORMING APPARATUS FOR WAFER HERMETIC CONTAINER IN SEMICONDUCTOR-FABRICATION EQUIPMENT OF MINIENVIRONMENT SYSTEM

FIELD OF THE INVENTION

This invention relates to a semiconductor-fabrication equipment of a minienvironment system used in a clean room for producing semiconductors.

DESCRIPTION OF THE PRIOR ART

Conventionally, in a clean room for producing semiconductors, a minienvironment system is adapted, where wafers are transferred and handled in a hermetic container to reduce investment and save energy. Recently, to obtain many semiconductor chips from a single wafer, a wafer of the size of 300 mm in diameter has become to be used.

In the minienvironment system of the 300 mm diameter wafer generation, a specification for a hermetic container to accommodate wafers and a specification for a loading part that transfers the wafers from the hermetic container into a semiconductor-fabrication equipment and from it into the hermetic container are international standards.

A conventional semiconductor-fabrication equipment of the minienvironment system, which is installed in a clean room 70, is configured as shown in FIG. 36 through 38. FIG. 36 is a schematic cross-sectional view of the conventional semiconductor-fabrication equipment of the minienvironment system 76, and FIG. 37 is an exploded perspective view of a hermetic container 71 and a loading device 78. FIG. 38 is a cross-sectional view of the main portion of the conventional semiconductor-fabrication equipment, where the hermetic container 71 accommodates wafers 73, which are vertically arranged in it, at its accommodating portion 72. The hermetic container 71 can be closed by closing a gateway 74 for the wafers 73 by a lid 75 and is placed on a movable table 79, which can be moved to and away from a loading part 78 securely attached to a front panel 77 of the semiconductor-fabrication equipment 76.

The semiconductor-fabrication equipment 76 is divided into two spaces by a separating wall 80 located at the center of the device 76, namely, a front, high cleanliness space 81 and a rear, low cleanliness space 82.

A fan filter unit 85, comprising a fan 83 and a filter 84, is installed at a ceiling of the high cleanliness space 81, and clean air 86 is supplied from the fan filter unit 85 to the high cleanliness space 81, keeping there a high cleanliness atmosphere.

An opening 87 is formed in the front panel 77 of the high cleanliness space 81 (which panel 77 constitutes the semiconductor-fabrication equipment 76) at a position that faces the lid 75 of the hermetic container 71, so that the opening 87 is connected to an opening 98 of the loading part 78 to act as a passage for the wafers 73 when they are drawn out from the hermetic container 71 into the high cleanliness space 81 or when they are placed in the hermetic container 71.

An electric motor 88 is fixedly mounted on the inner, lower surface of the front panel 77 and is connected to an opening/closing arm 89 through a speed reducer (not shown) to move the arm 89 vertically and forwardly and backwardly. A plate 90 is fixedly mounted on the opening/closing arm 89 at its upper end located at the opening 87 so as to engage with and then open or close the lid 75. The number 91 denotes engaging projections formed on the plate 90, for engaging with corresponding receiving portions 92 formed on the lid 75 so as to secure the plate 90 to the lid 75.

Further, a robot 94 is also installed in the high cleanliness space 81. The robot is provided with an arm 93 at its upper part for drawing a wafer 73 from the hermetic container 71 into the high cleanliness space 81 or inserting the wafer into the hermetic container 71. A wafer 73 is drawn into the high cleanliness space 81 by the arm 93 and is then transferred by the robot 95 to a chamber 95 located in the low cleanliness space 82 and is the processed in the chamber 95. The processed wafer 73 is moved onto the arm 93 and then placed in the hermetic container 71.

In operation, to draw a wafer 73 from the hermetic container 71 onto the arm 93, the electric motor 88 is operated first to forward the opening/closing arm 89 to engage the engaging projections 91 of the plate 90 with the receiving portions 92 of the lid 75 of the hermetic container 71, so that the plate 90 and the lid 75 are secured together. The opening/closing arm 89 is then moved back to draw the lid 75 together with the plate 90 into the high cleanliness space 81, to open the container 71. The opening/closing arm 89 is then lowered to open the openings 87 and 98, and the operation of the electric motor 88 is then stopped.

The robot 94 is then operated to move the arm 93 through the openings 87 and 98 until the arm 93 is located under a wafer 73, which is now to be transferred. The wafer 73 is carried on the arm 93 and drawn by it from the hermetic container 71 into the high cleanliness space 81 of the semiconductor-fabrication equipment 76 and is further moved into the chamber 95 of the low cleanliness space 81 of the semiconductor-fabrication equipment 76 by the robot 94 for being processed in the chamber 95.

The wafer 73, which has been drawn into the high cleanliness space 81 and into the chamber 95 and processed therein, is placed on the arm 93 by operating the robot 94 and passed through the openings 87, 98 and the opened gateway 74 into the hermetic container 71. By repeating the operation, all the wafers 73 are in turn carried into the semiconductor-fabrication equipment 76 and processed there. When the process has been completed for all the wafers 73 in the hermetic container 71, the electric motor 88 is operated to raise and then forward the opening/closing arm 89 to attach the lid 75, which is secured to the plate 90 of the opening/closing arm 89, to the gateway 74 of the hermetic container 71. By disengaging the engaging projections 91 from the receiving portions 92, the hermetic container 71 is closed.

In the hermetic container 71 and the loading part 78 specified by the conventional standards, as shown in FIG. 38 the fundamental design thought is an idea to prevent the streams of the ambient air 97, 97 (shown by solid arrows), which may enter the hermetic container 71 from a gap 96 between the gateway 74 of the hermetic container 71 and the opening 98 of the loading part 78 when the lid 75 of the hermetic container 71 located at the loading part 78 is opened and moved into the high cleanliness space 81 of the semiconductor-fabrication equipment 7 by the opening/closing arm 89, from entering the hermetic container 71 by the streams of air 99, 99 (shown by dotted-line arrows) injected from a gap 96, which air is supplied by the fan filter unit 85. Further, since a plurality of openings 101 are formed in the floor 100 of the semiconductor device 76 to cause the cleanliness air to flow downward in layers, the fan filter unit 85 must increase the pressure in the high cleanliness space 81 to cause the streams 99, 99 to be sufficiently strongly injected, to prevent the streams of ambient air 97, 97 from entering the hermetic container 71. To that end, the amount and pressure of the air from the fan filter unit 85 must be made great. However, if the amount and pressure of the air from the fan filter unit 85 are made great, the cleanliness air 86 cannot be formed as layers, and thus the desirable cleanliness cannot be kept in the high cleanliness space 81. Accordingly, in the hermetic container 71 and the loading part 78 specified by the conventional standards, a sufficient amount and pressure of the air cannot be insured from the fan filer unit 85. Thus the streams of the ambient air 97, 97 shown in the solid arrows enter the hermetic container 71 through the gap 96, thereby causing a problem in that the dust entrained in the entered air adheres to the wafers in the hermetic containers 21.

The present invention has been conceived to resolve that problem, and it aims to provide a semiconductor-fabrication equipment of a minienvironment system wherein an air curtain is formed around the periphery of an opening of the loading part attached to the front panel of the semiconductor-fabrication equipment, which opening acts as the passage for the wafer, by attaching or embedding a clean-air injection device to the periphery of the opening, for injecting clean air at the gap between the opening and the wafer gateway of the hermetic container, preventing dust-entraining ambient air from passing through the gap so that the dust does not adhere to the wafers in the hermetic container.

SUMMARY OF THE INVENTION

The problem discussed above is resolved by adapting one of the following means:

In a semiconductor-fabrication equipment of a minienviroment system wherein a wafer in a hermetic container is taken out into the semiconductor-fabrication equipment, and a processed wafer is put in the hermetic container, an clean-air injection device, which is connected to an air-supply device through an air-supply tube, is attached to the periphery of an opening of the semiconductor-fabrication equipment, the clean-air injection device includes a filter means of cylindrically shaped filters connected to each other to be a rectangular frame; a filter case formed as a rectangular frame for encasing the filter means; and a guide cover formed with an injection slit and a guide slit in front of the filter case, wherein an clean air is injected from the clean-air injection device to form an air curtain at a gap between an opening of a loading part attached to the semiconductor-fabrication equipment and a gateway of the hermetic container through which a wafer is taken out of or put in the hermetic container so as to prevent an ambient air from passing through the gap into the hermetic container when a lid of the hermetic container is opened to the semiconductor-fabrication equipment;

In a semiconductor-fabrication equipment of a minienviroment system wherein a wafer in a hermetic container is taken out into the semiconductor-fabrication equipment, and a processed wafer is put in the hermetic container, an clean-air injection device, which is connected to an air-supply device through an air-supply tube, is embedded in the periphery of an opening of the semiconductor-fabrication equipment, the clean-air injection device includes a filter means of cylindrically shaped filters connected to each other to be a rectangular frame, the filter means being encased in a rectangular notch formed at the periphery of the opening; and a cover formed with an injection slit and a guide slit and secured to the notch, wherein an clean air is injected from the clean-air injection device to form an air curtain at a gap between an opening of a loading part attached to the semiconductor-fabrication equipment and a gateway of the hermetic container through which a wafer is taken out of or put in the hermetic container so as to prevent an ambient air from passing through the gap into the hermetic container when a lid of the hermetic container is opened to the semiconductor-fabrication equipment;

In a semiconductor-fabrication equipment of a minienviroment system wherein a wafer in a hermetic container is taken out into the semiconductor-fabrication equipment, and a processed wafer is put in the hermetic container, an clean-air injection device, which is connected to an air-supply device through an air-supply passage disposed in a front panel of the semiconductor-fabrication equipment, is embedded in the periphery of an opening of the semiconductor-fabrication equipment, the clean-air injection device includes a filter means of cylindrically shaped filters connected to each other to be a rectangular frame, the filter means being encased in a rectangular notch formed at the periphery of the opening; and a cover formed with an injection slit and a guide slit and secured to the notch, wherein an clean air is injected from the clean-air injection device to form an air curtain at a gap between an opening of a loading part attached to the semiconductor-fabrication equipment and a gateway of the hermetic container through which a wafer is taken out of or put in the hermetic container so as to prevent an ambient air from passing through the gap into the hermetic container when a lid of the hermetic container is opened to the semiconductor-fabrication equipment.

Figure 1:
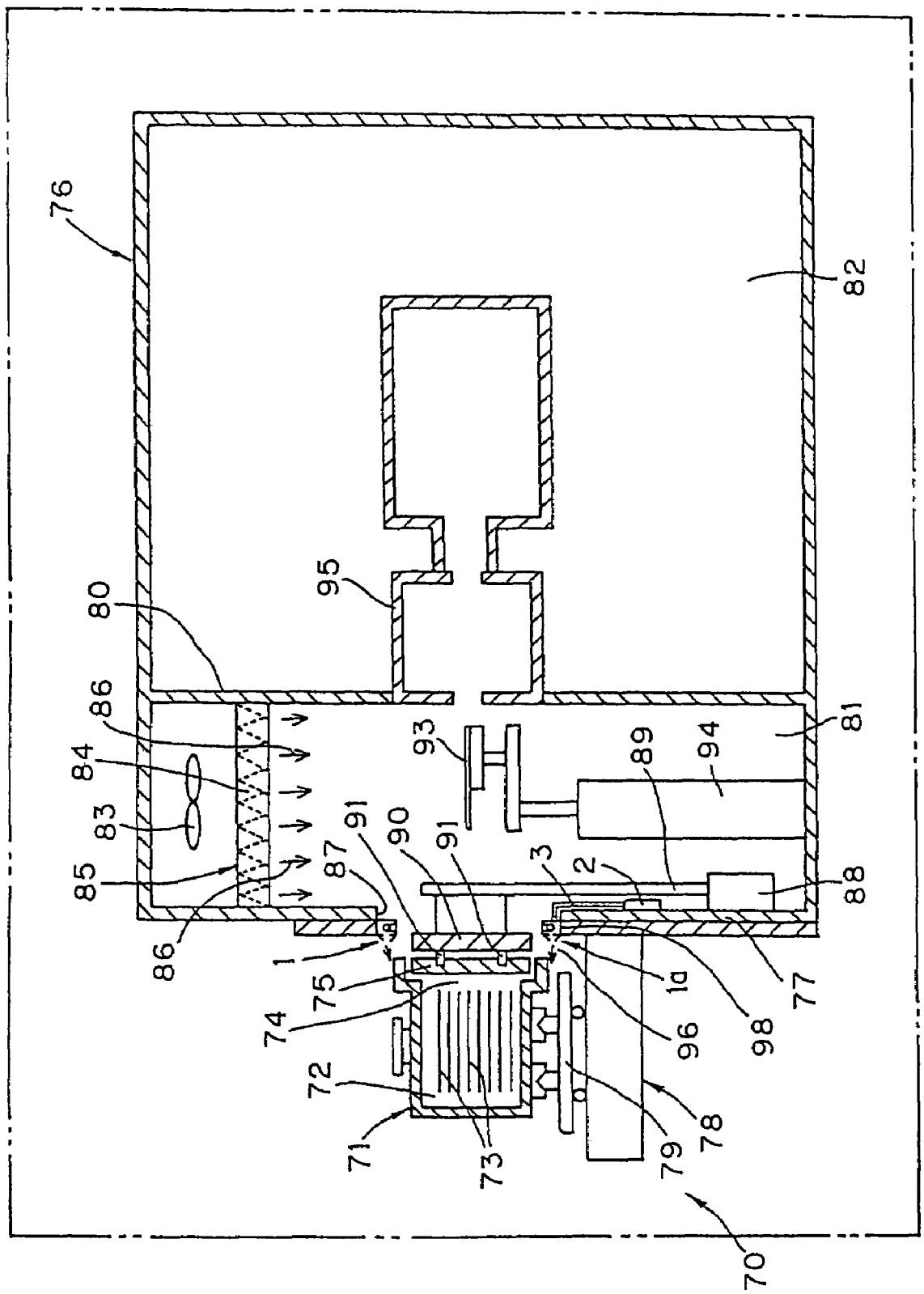
FIG. 1 is a schematic sectional view of a first embodiment of the semiconductor-fabrication equipment of a minienvironment system of the present invention, wherein the semiconductor-fabrication equipment has a clean-air injection device to be attached to the periphery of the opening of a loading part.

In the drawings, the number 1 denotes a clean-air injection device; 2 an air-supply device; 3 an air-supply tube; 6a-6i filter means; 7 a filter box; 8 a guide lid; 10 a cylindrically-shaped filter; 71 a hermetic container; 73 a wafer; 74 a gateway; 76 a semiconductor-fabrication equipment; 77 a front panel; 78 a loading part; 96 a gap; 98 an opening; 111 a clean-air injection device; 112 an air-supply device; 113 an air-supply tube; 114 a notch; 115 a cylindrically-shaped filter; 119 filter means; 121 injecting slit; 122 a guide plate; 123 a cover; and 131 an air-passage line.

PREFERRED EMBODIMENTS OF THE INVENTION

The embodiments of the present invention are now explained with reference to the accompanying drawings, wherein the same reference numbers are used for the same elements that are also used in the conventional semiconductor device discussed above, and explanations for the structure and the function of those elements are omitted.

In the semiconductor-fabrication equipment of a minienvironment system of the present invention, a clean-air supply device 1 is attached to or embedded in the periphery of an opening 98 of a loading part 78 of a conventional semiconductor-fabrication equipment 76. The opening 98 of the loading part 78 is formed in a front panel 77 of the conventional semiconductor-fabrication equipment 76 to act as a passage for drawing a wafer 73 in a hermetic container 71 from it into a high cleanliness space 81 of the semiconductor-fabrication equipment 76 and for placing the wafer 73 from the semiconductor-fabrication equipment 76 into the hermetic container 71. Clean air is injected from the clean-air injection device 1, which is connected to an air-supply device, outwardly at the outer periphery of the opening 98 to form an air curtain between the gateway 74 of the hermetic container 71 and the opening 98, preventing the dust-entraining ambient air in the clean room from entering the hermetic containers 71, i.e., preventing the dust from adhering to the wafers 73.

FIG. 1 is a schematic sectional view of a semiconductor-fabrication equipment of a minienvironment system of the present invention provided with a first embodiment of a clean-air injection device 1a, which is attached to the periphery of the opening 98 of the loading part 78. The loading part 78 of the semiconductor-fabrication equipment installed in a clean room 70 shown in FIG. 1 is a one specified by a world standard specification. A clean-air injection device 1a and an air-supply device 2 are disposed in a limited space of a high cleanliness space 81 of the semiconductor-fabrication equipment, which space 81 is specified by a world standard specification.

In the semiconductor-fabrication equipment of a minienvironment system of the present invention provided with the clean-air injection device of the type to be attached to the periphery of the opening 98 of the loading part 78, the clean-air injecting device 1a of the first embodiment is connected to the air-supply device 2 through an air-supply tube 3 such that the clean-air injecting device 1a and air-supply device 2 are separately disposed in the limited space in the semiconductor-fabrication equipment 76.

Figure 4:
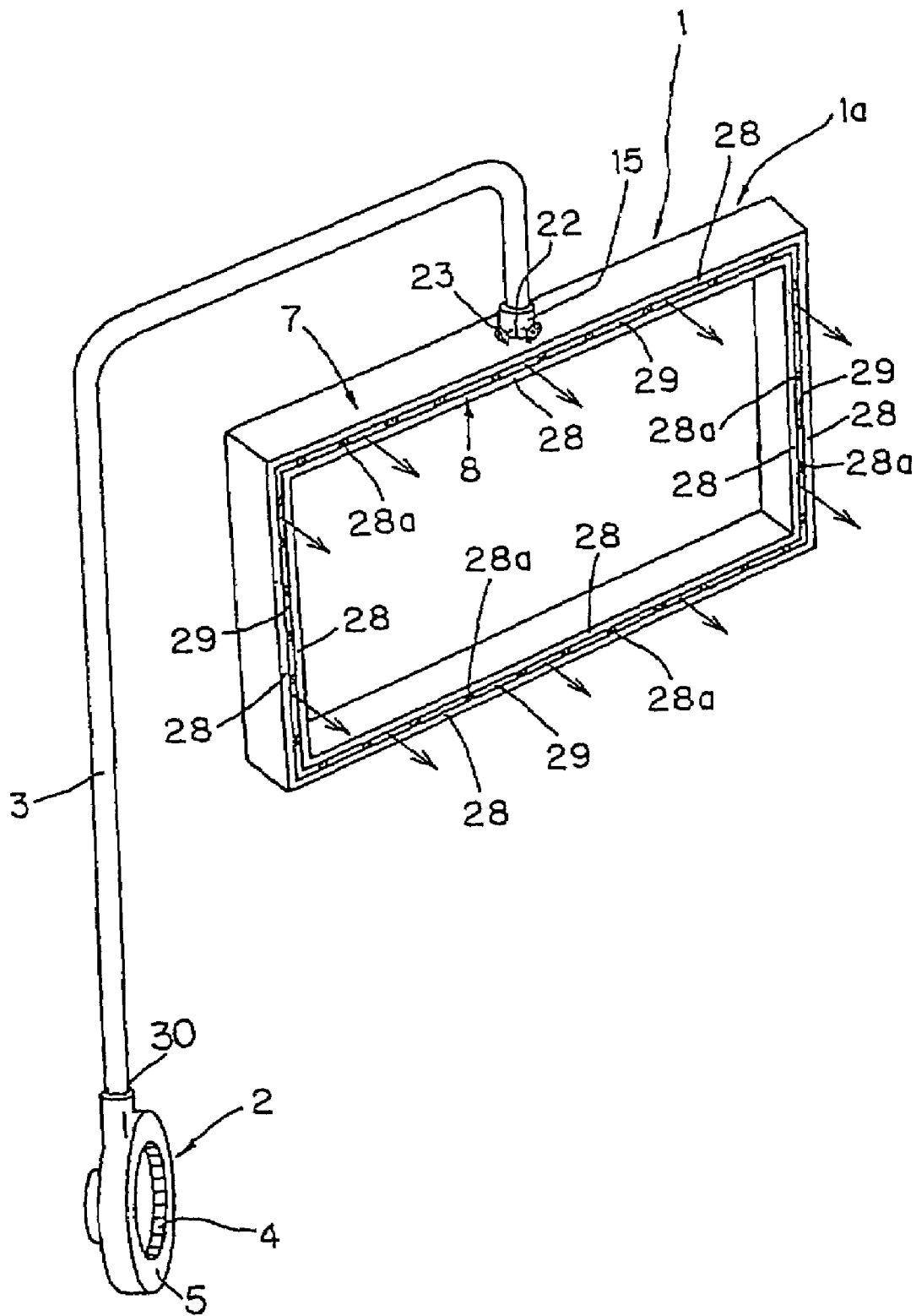
FIG. 4 is a schematic perspective view showing the clean-air injection device of the first embodiment and an air-supply device.
Figure 5:
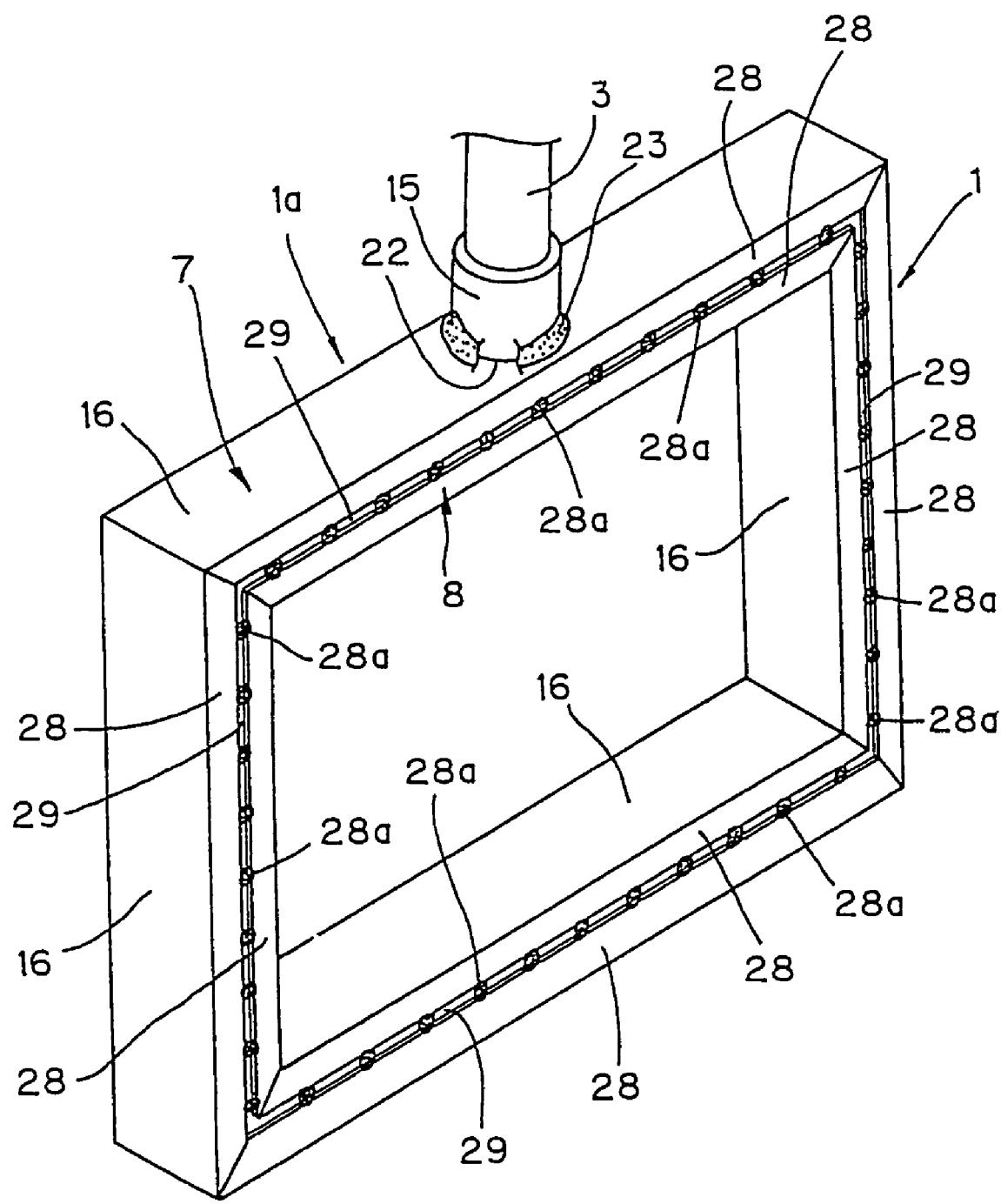
FIG. 5 is a perspective view of the clean-air injection device of the first embodiment, wherein a part of it is cut away.

The clean-air injecting device 1a is shaped as a thin rectangular frame and is fixedly mounted on the periphery of the opening 98 of the loading part 78 so that it does not hinder the plate 90 from moving vertically and forwardly and backwardly. Further, the air-supply device 2 is also shaped as a thin body so that it does not hinder the electric motor 88 and the opening/closing arm 89 from moving and is mounded on the inner surface of the front panel 77, being spaced apart from the electric motor. Since the air-supply device 2 must be thin, it has an annular air-suction part 5 provided with a sirocco fan 4 for air suction as shown in FIG. 4. The sirocco fan 4 sucks clean air in the high cleanliness space 81 and supplies it to the clean-air injection device 1a through the air-supply tube 3.

Figure 2:
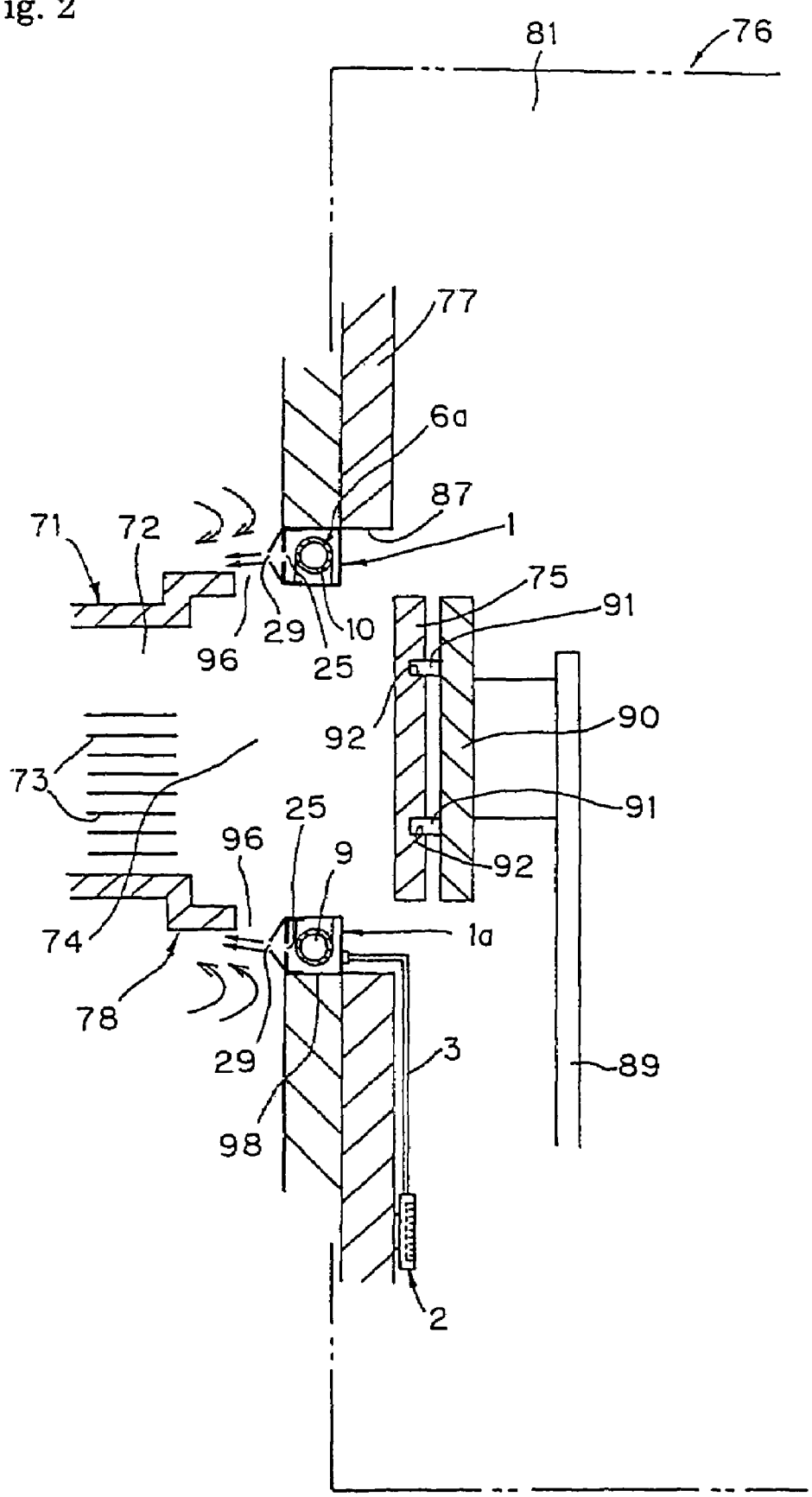
FIG. 2 is a schematic sectional view of the first embodiment of FIG. 1, showing the main part of the semiconductor-fabrication equipment.

As shown in FIGS. 1 and 2, the clean-air injection device 1a, which is fixedly mounted on the periphery of the opening 98 of the loading part 78 attached to the front panel 77 of the of the semiconductor-fabrication equipment 76, is configured to inject clean-air outwardly at the outer edge of the periphery of the opening 98. In the first embodiment of this invention, clean-air injecting device 1a is formed as a rectangular frame to meet the rectangular opening 98.

Specifically, the clean-air injecting device 1a is composed by filter means 6a, a filter case 7 for encasing the filter means 6a, and a rectangular guide cover 8 disposed at the front surface, i.e., the downstream side, of the filter case 7

Figure 3:
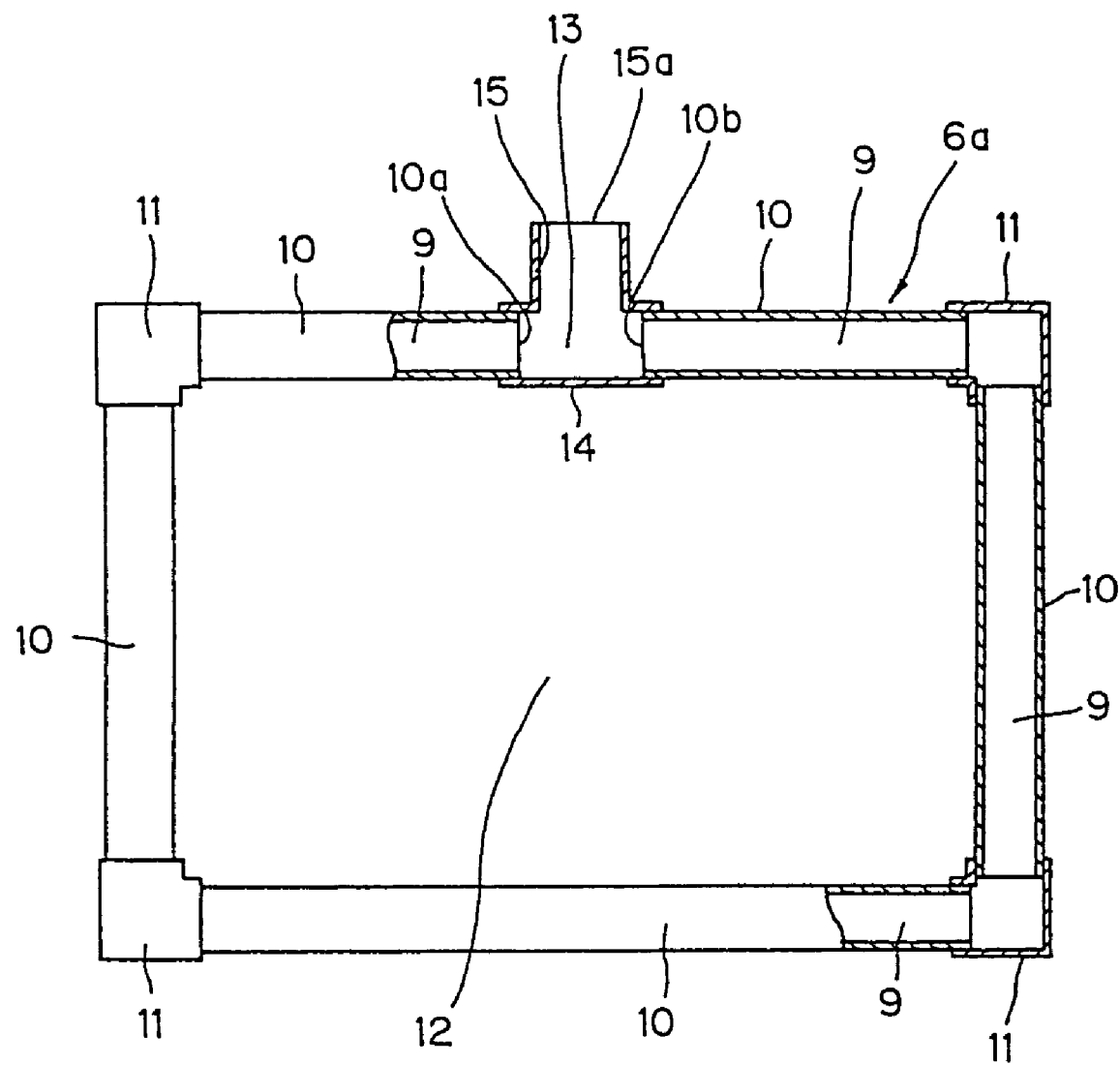
FIG. 3 is a partly sectional front view of the clean-air injection device of the first embodiment, wherein a part of a filer means of the clean-air injection device is cut away.

The filter means 6a define a rectangular or annular air passage 9. Cylindrical filters 10, which are shaped by rounding filter material, and which are connected to each other at their ends by L-joints 11, form the air passage 9. The filter means 6a defines a space in its inner side, which space is slightly larger than the periphery of the opening 98. One of the lateral filters 10 (the upper lateral filter in FIG. 3) is cut at its central part, proving a spacing part 13 between the cut end surfaces 10a and 10b, and the end surfaces 10a and 10b are connected by a I-shape joint 14. The I-joint 14 has an air-feed tube 15 extending upwardly and having an air-feed port 15a at the top connected to the air-supply device 2.

Figure 6:
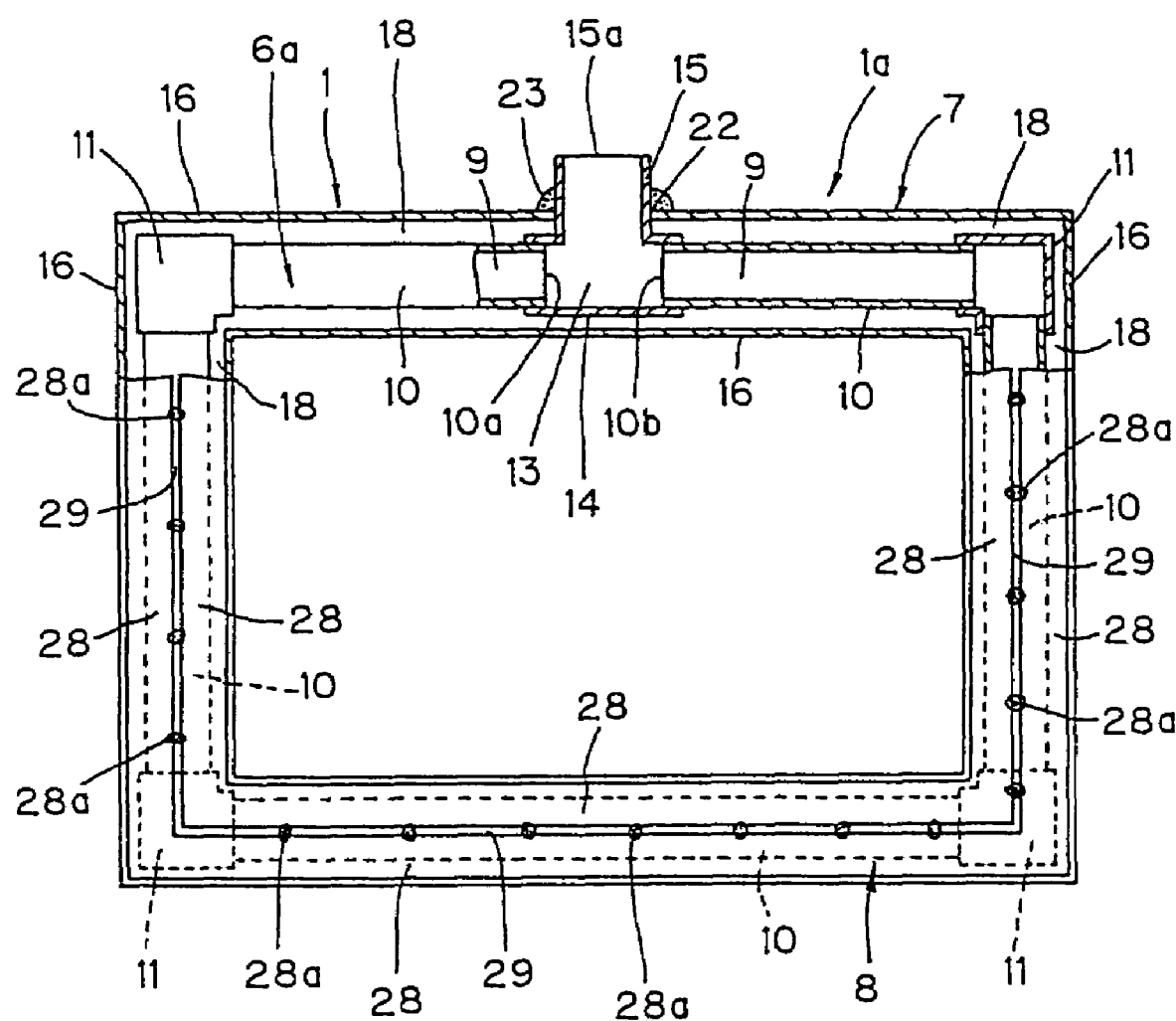
FIG. 6 is a front view of the clean-air injection device of the first embodiment, wherein a part of it is cut away.
Figure 7:
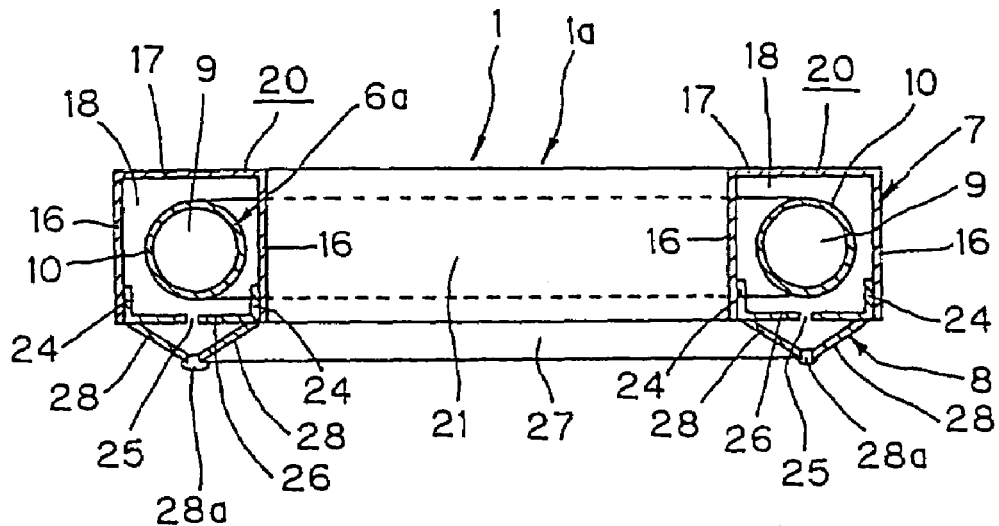
FIG. 7 is a cross-sectional view of the clean-air injection device of the first embodiment.
Figure 8:
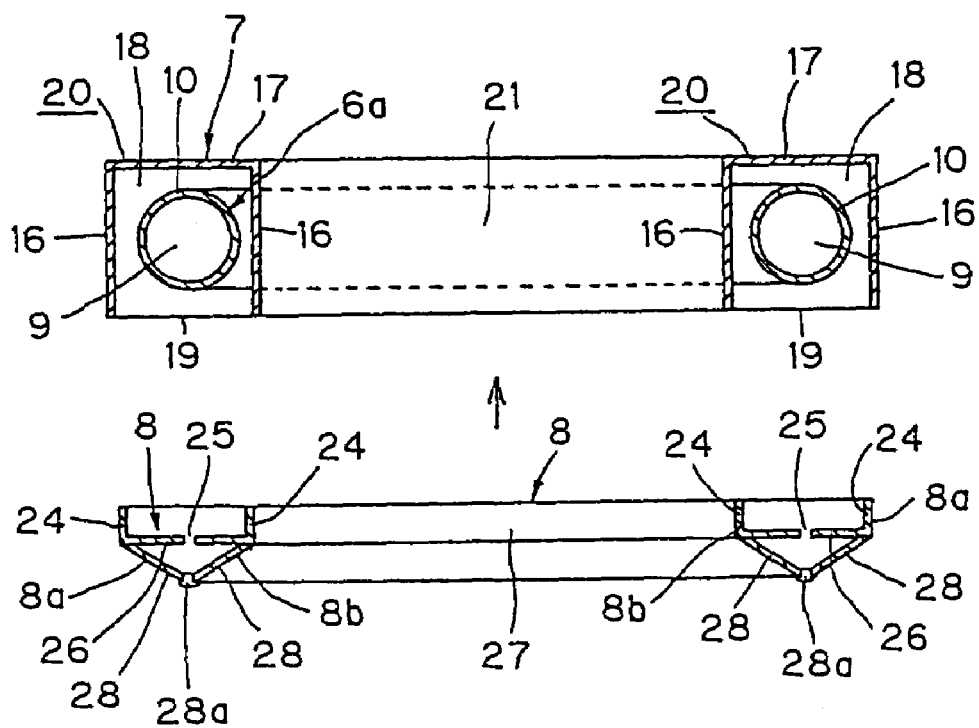
FIG. 8 is an exploded view of the clean-air injection device of the first embodiment.

The filter case 7 is formed as a rectangular frame by connecting channel-shaped plates 20, each of which is formed by jointing side plates 16 and a back plate 17. The channel-shaped plate 20 has a cavity 18 having a width that is greater than the diameter of the cylindrical filter 10, and it has also opening 19 at its front, i.e., the downstream side. The filter case 7 defines a space 21 at its center, which is slightly greater than the periphery of the opening 98. Further, an aperture 22 is formed in the upper outer side plate 16 as shown in FIG. 6 so that the air-supply tube 15 can pass through it. In the drawing the number 23 denotes a seal applied to the joint of the aperture 22 and the air-supply tube.

Further, the guide cover 8 is removably mounted on the filter case 77 at its front opening 19. The guide cover 8 includes sliding pieces 24 and guide plates 26 perpendicularly secured to the sliding pieces 24. The sliding pieces 24 can be slidably fitted on the inner surfaces of the side plates 16, 16. The guide plates 26 forms a slit therebetween extending along the length of the guide cover, for injecting clean air injected from the filter means 6a. Further, inclined rectifier plates 28, 28 are fixed to the guide plates 26, 26, forming a guide slit 29 therebetween for guiding the clean air injected from the slit 25 and for unifying the distribution of the clean air. The rectifier plates are jointed at some points therebetween by spot welding 28a. The sliding pieces 24, guide plates 26, rectifier plates of the cover 8 are formed as rectangular frames, respectively, and the cover 8 defines a space 27 at its center, the size of which is the same as that of the filter case.

Although it is not necessary to limit the sizes of the injection slit 25 and the guide slit 29 to any special one, they are preferably a 1.5 mm in width. Further, the points of the spot welding 28a are preferably spaced about 5 cm.

The sliding pieces 24 of the guide cover 8 configured as discussed above are inserted into the openings 19 at the front of the filter case 7 and are slidably moved along and engaged with the inner surfaces of the side plates 16, so that the guide cover 8 is detachably secured to the filter case 7, to form the clean-air injection device 1a.

The clean-air injection device 1a is attached to the periphery of the opening 98 so that the guide slit 29 faces to the gap 96 between the opening 98 and the gateway 74 of the hermetic container 71. Further, the air-supply port 30 of the air-supply device 2 is connected to the air-feed port 15a of the clean-air injection device 1a via the air-supply tube 3.

The air in the high cleanliness space 81 is pumped by the clean-air supply device 2 into the filter means 6a through the air-feed port 15a, i.e., into the air passage 9 of each cylindrical filter 10 of the filter means 6a, and is then filtered by the filter material of the filter 10 and is injected into the cavity 18 of the filter case 7 as more clean air than the clean air in the high cleanliness space 81. The more clean air is then injected from the injection slit 25 and is then rectified by the rectifier plates 28 and ejected from the guide slit 29 as a stream having a uniformed pressure distribution.

Since the filter means 6a of the clean-air injection device 1a is formed by using the cylindrically shaped filters 10, the flow resistance of the cylindrically shaped filters 10 in the passage is less than the filter loss (about 200 Pa). Thus the injection speed of the clean air from the injection slit 25 is substantially uniformly kept at any part of the slits, which is near or remote from the air-feed port 15a. That is, the air injection speed at the injection slit 25 of the upper cylindricaly-shaped filter 10, which is located at the air-feed tube 15 side, is substantially the same as the air injection speed at the injection slit 25 of the lower cylindricaly-shaped filter 10, which is located opposite to the upper cylindricaly-shaped filter 10.

Since all the air injected from the cylindrically shaped filters 10 is clean air, applying sealing to the filter case 7 or the guide cover 8 is not necessary, except for the part to which the sealing 23 is applied.

Further, since the guide cover 8 is fitted between the side plates 16 of the filter case 7 with the sliding pieces 24 of the guide cover 8 slidably engaging the inner surfaces of the side plates 16, it can be easily separated from the filter case 7, and the used filter means 6a can be changed with a new one.

Figure 9:
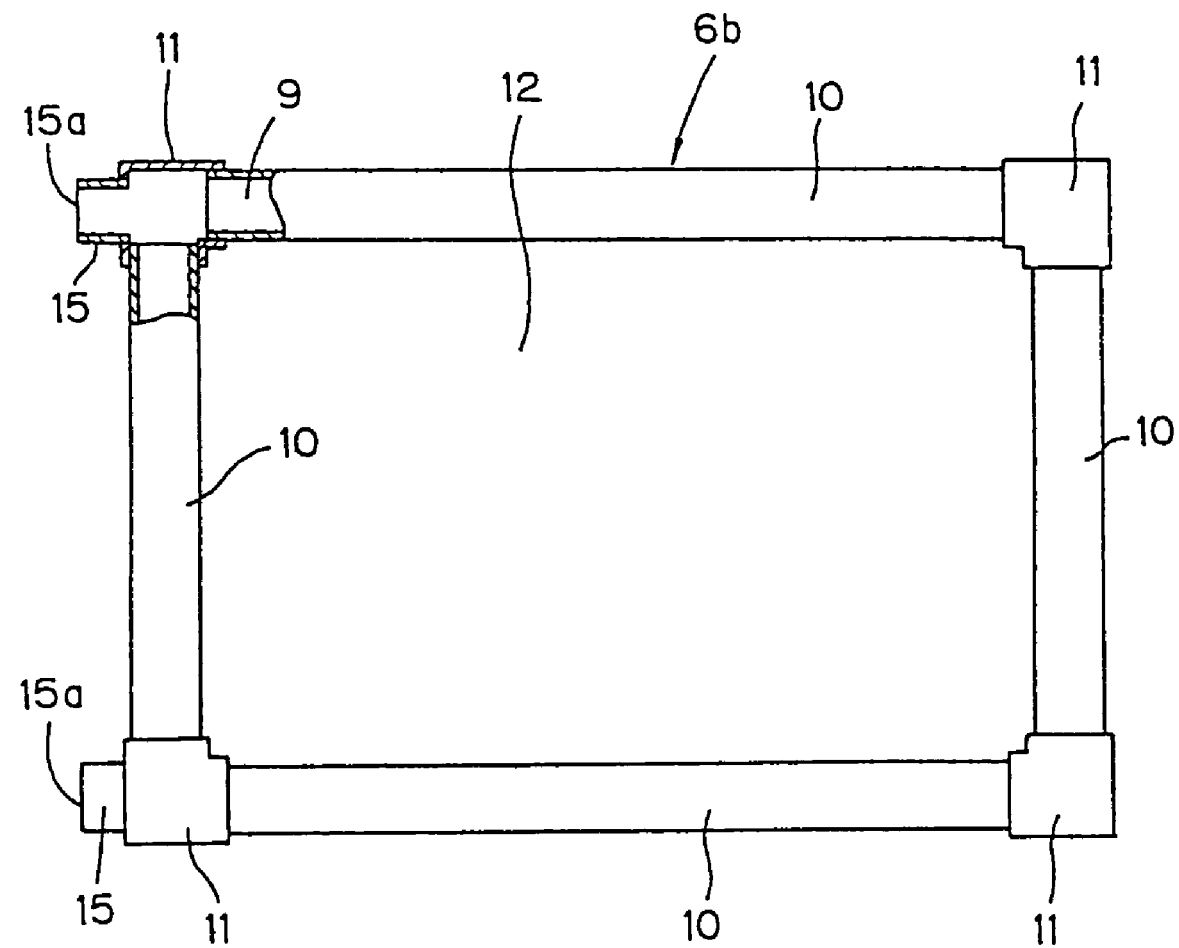
FIG. 9 is a partly sectional front view of the clean-air injection device of a second embodiment of the semiconductor-fabrication equipment of the present invention, adapted to be attached to the periphery of the opening of the loading part.

FIG. 9 is a front view of filter means 6b of a clean-air injecting device 1b of the second embodiment of the type to be attached to the periphery of the opening 98 of the loading part 78 of the semiconductor-manufacturing equipment of the minienvironment system of the present invention. The filter means 6b is formed as a rectangular frame with cylindrically shaped filters 10, which are formed as in the filter means 6a and connected by L-joints 11. The filter means 6b define a rectangular air passage 9 and have a space 12 in its inner side, which is slightly greater than the periphery of the opening 98. Two of the L-joints 11 located one side of the filter means 6b, i.e., the left or right side, (in FIG. 9, the left side) have air-feed pipes 15 laterally projecting and having air-feed ports 15a.

The filter means 6b configured as discussed above is encased in the rectangular cavity 18 of a filter case 7, which is similar to the filter case 7 of the first embodiment, wherein apertures 22, 22 are formed in the outer side plate 16 so that the laterally extending air-feed pipes 15 pass through them. The guide cover 8 the same as in the first embodiment is detachably secured to the filter case 7 at its front, to form a clean-air injection device 1b.

Figure 10:
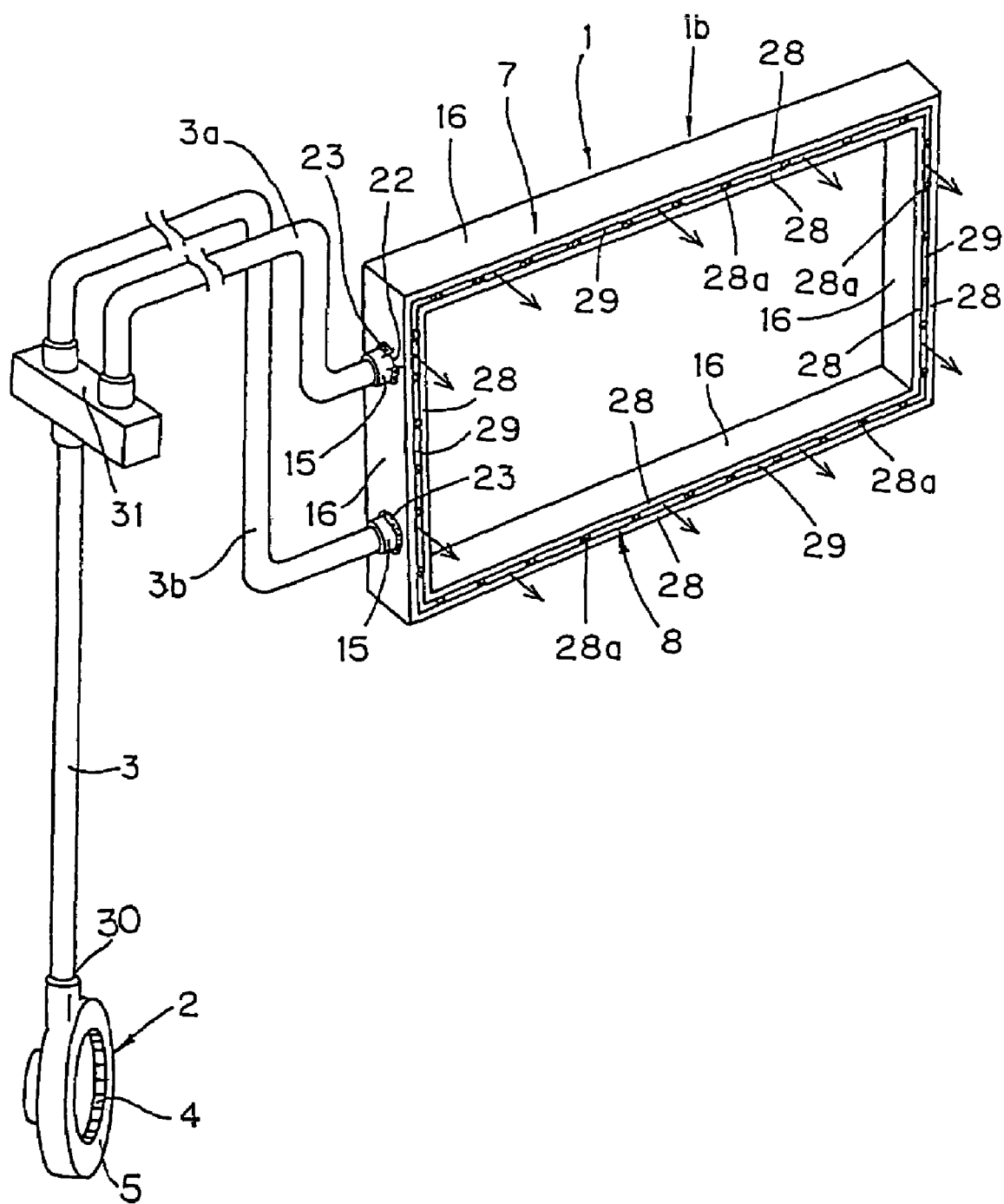
FIG. 10 is a schematic perspective view of the clean-air injection device of the second embodiment and an air-supply device.

Since the clean-air injection device 1b of the second embodiment has two air-feed ports 15a for receiving air supply from the air-supply device 2, the air-supply tube 3 is divided to two sub-air-supply tubes 3a, 3b through a dividing box 31, as shown in FIG. 10. In the drawing, the number 23 denotes sealing applied to the junctions of the air-feed pipes 15 and the apertures 22 of the filter case.

Using the clean-air injection device 1b of the second embodiment causes the injection speed of the clean air to be injected more uniformly and causes the flow rate of the air injected to be greater than using the clean-air injection device 1a of the first embodiment. Since the other functions of it are the same as in the first embodiment, the description for them is omitted.

Figure 11:
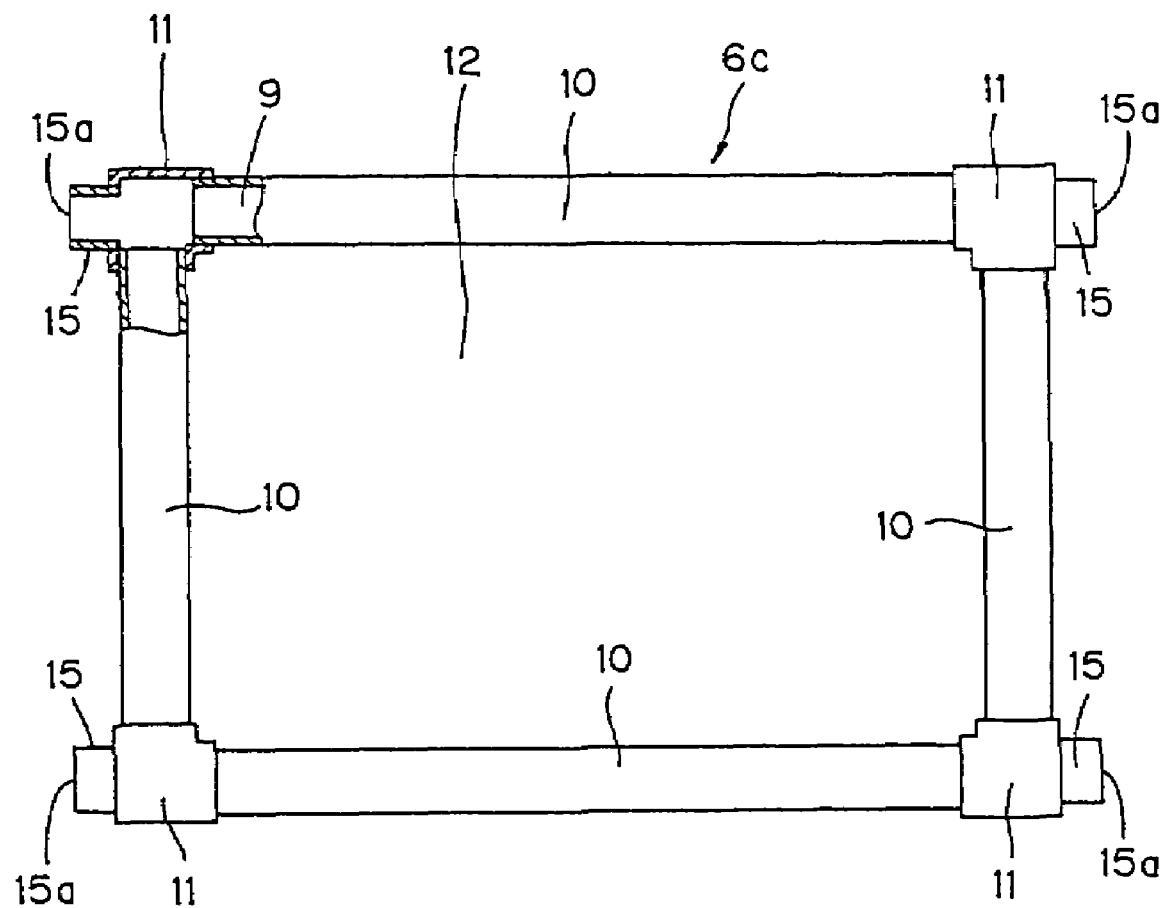
FIG. 11 is a partly sectional front view of a clean-air injection device of a third embodiment of the semiconductor-fabrication equipment of a minienvironment system of the present invention, adapted to be attached to the periphery of the opening of the loading part, wherein a part of filter means of the clean-air injection device is cut away.

FIG. 11 is a front view of filter means 6c of a clean-air injecting device 1c of the third embodiment of the type to be attached to the periphery of the opening 98 of the loading part 78 of the semiconductor-manufacturing equipment of the minienvironment system of the present invention. The filter means 6c is formed as a rectangular frame with cylindrically shaped filters 10, which are formed as in the filter means 6a and connected by L-joints 11. The filter means 6c define a rectangular air passage 9 and have a space 12 in its inner side, which is slightly greater than the periphery of the opening 98. Each of four L-joints 11 has an air-feed pipe 15 laterally projecting and having air-feed ports 15a.

The filter means 6c configured as discussed above is encased in the rectangular cavity 18 of a filter case 7, which is similar to the filter case 7 of the first embodiment, wherein apertures 22 are formed in the outer side plates 16 so that the laterally extending air-feed pipes 15 pass through them. The guide cover 8 the same as in the first embodiment is detachably secured to the filter case 7 at its front, to form a clean-air injection device 1c.

Figure 12:
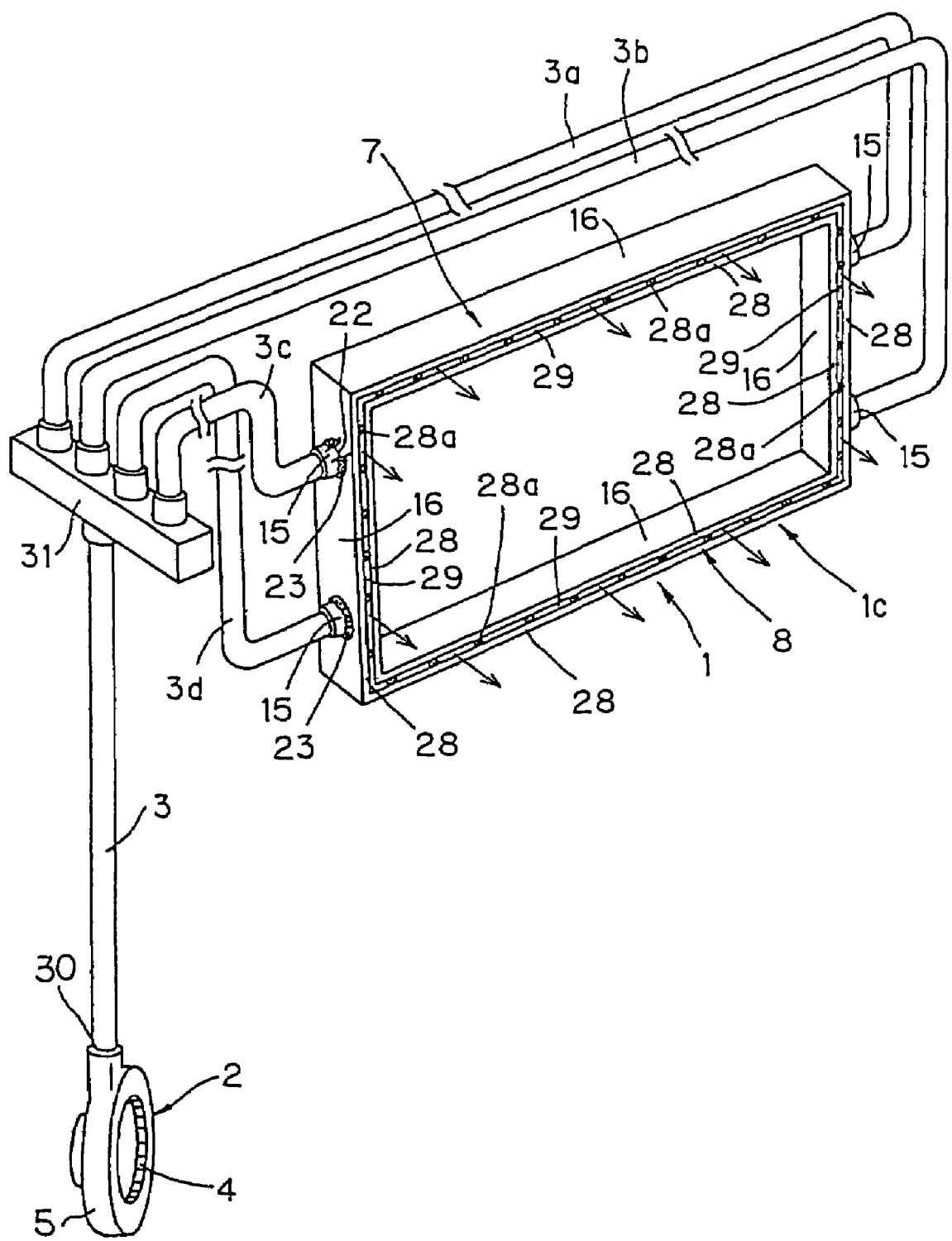
FIG. 12 is a schematic perspective view of the clean-air injection device of the third embodiment and an air-supply device.

Since differing from the first embodiment, the clean-air injection device 1c of the third embodiment has two air-feed ports 15a for receiving air supply from the air-supply device 2, the air-supply tube 3 is divided to four sub-air-supply tubes 3a, 3b, 3c, and 3d through a dividing box 31, as shown in FIG. 12. In the drawing, the number 23 denotes sealing applied to the junctions of the air-feed pipes 15 and the apertures 22 of the filter case.

Using the clean-air injection device 1c of the third embodiment causes the injection speed of the clean air to be injected more uniformly and causes the flow rate of the air injected to be greater than using the clean-air injection device 1a of the first embodiment. Since the other functions of it are the same as in the first embodiment, the description for them is omitted.

Figure 13:
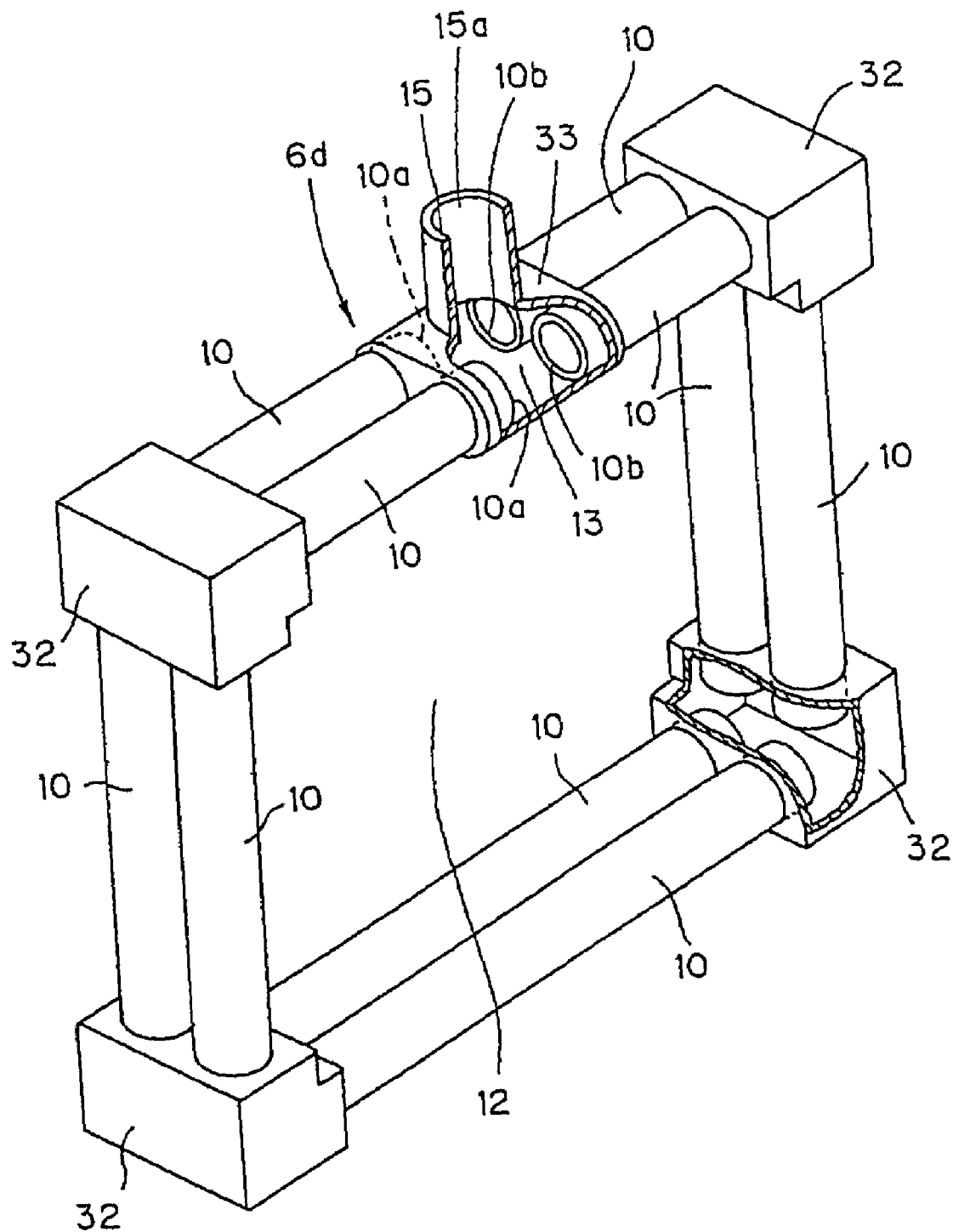
FIG. 13 is a partly sectional perspective view of a clean-air injection device of a fourth embodiment of the semiconductor-fabrication equipment of a minienvironment system of the present invention, adapted to be attached to the periphery of the opening of the loading part, wherein a part of filter means of the clean-air injection device is cut away.
Figure 16:
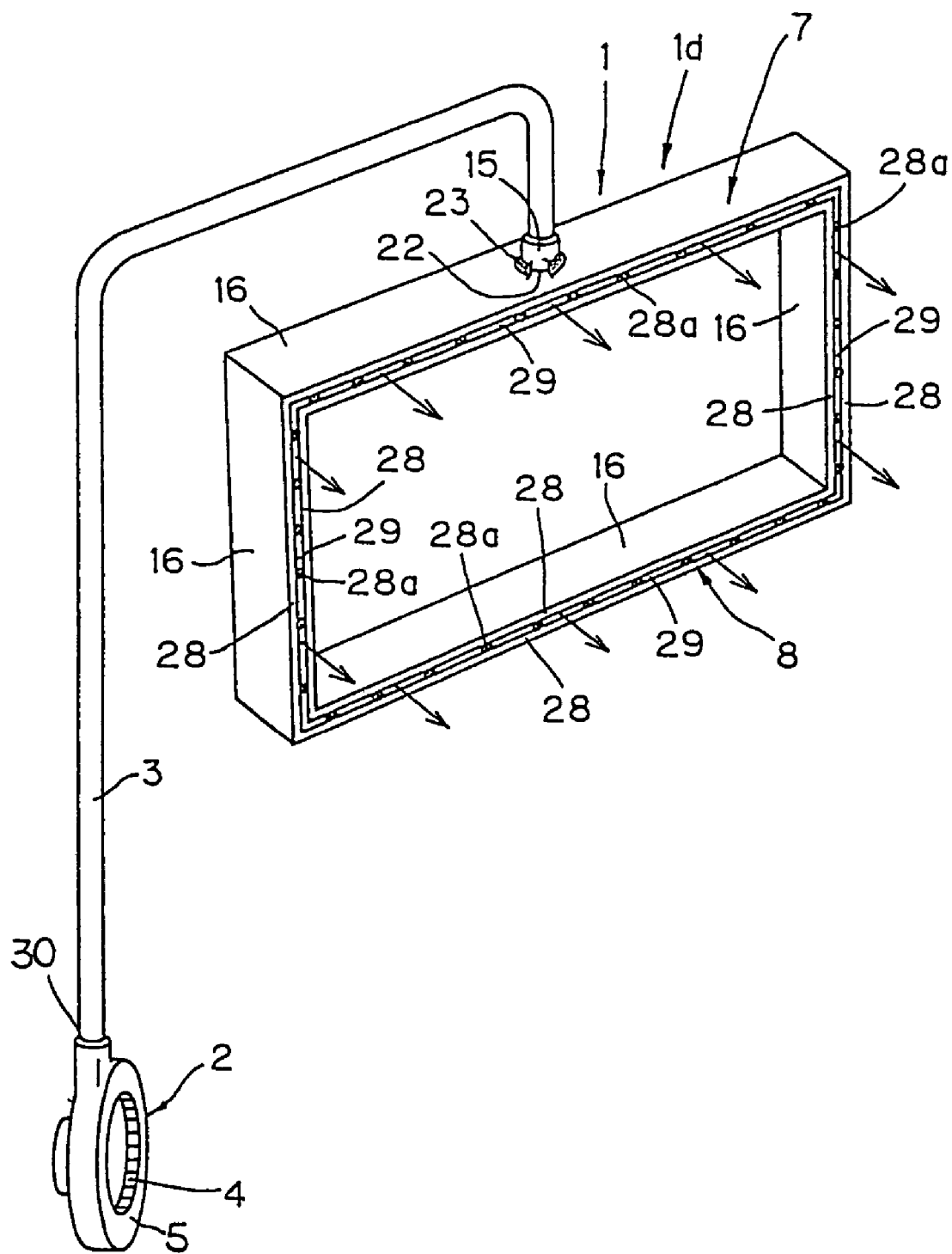
FIG. 16 is a schematic perspective view of the clean-air injection device of the fourth embodiment and an air-supply device.

FIG. 13 is a perspective view of filter means 6d of a clean-air injecting device 1d of the fourth embodiment of the type to be attached to the periphery of the opening 98 of the loading part 78 of the semiconductor-manufacturing equipment of the minienvironment system of the present invention. The same as in the first embodiment, the clean-air injecting device 1d, which is provided with the filter means 6d, is connected to the air-supply device 2 through an air-supply tube 3 as shown in FIG. 16. However, the fourth embodiment of the clean-air injection device 1d differ from the first embodiment of the clean-air injection device 1a in that in the filter means 6a of the first embodiment the cylindrical filters 10 are formed as a single row of a rectangular frame, while in the filter means 6d of the fourth embodiment the cylindrical filters 10 are formed as a plurality of rows of rectangular frames (two rows in FIG. 16).

The clean-air injection device 1d of the fourth embodiment may be used when the air to be injected is increased by increasing the area of the filters, or when the depth of the cylindrically shaped filters 10 can be great, but other sizes must be small. In this embodiment the area of the filters can be increased to increase the air to be injected.

In the filter means 6d the cylindrically shaped filters 10 are disposed in two rows in the direction of depth and are jointed at their ends by L-joints 32, which have an enough depth, to define rectangular double passages 9 for air and an inside space 12, which is larger than the periphery of the opening 98. Further, the central parts of the upper or lower rows of the cylindrically shaped filters 10 (the upper rows in FIG. 13) are cut away to form a spacing part 13 between cut ends 10a and 10b, and the cut ends are connected by a I-joint 33, which has a enough size in the direction of depth, and which has an air-feed pipe 15 extending upwardly and having an air-feed port 15a for receiving air from the air-supply device 2.

Figure 14:
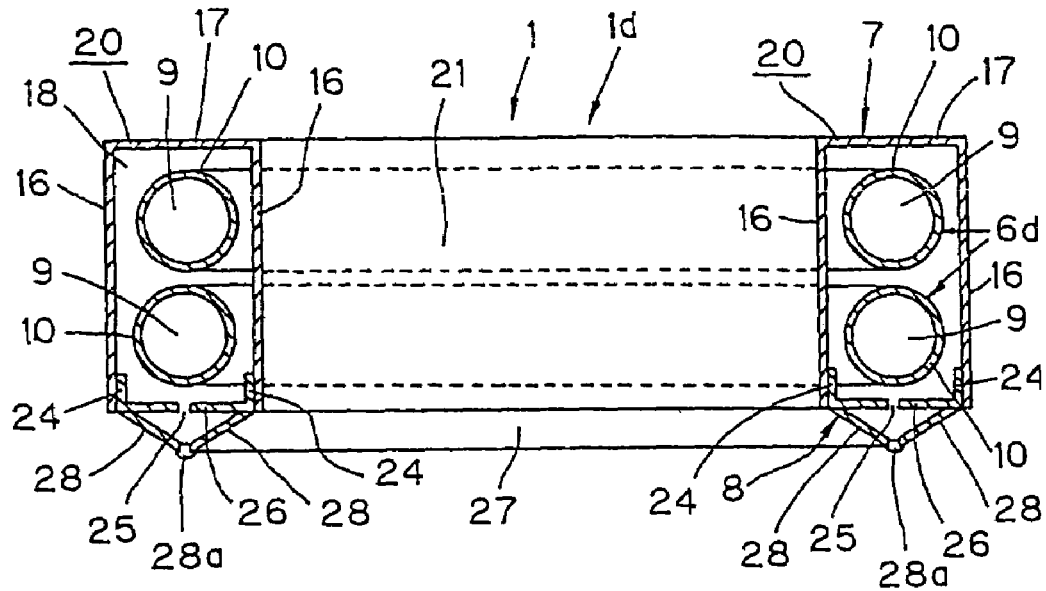
FIG. 14 is a cross-sectional view of the clean-air injection device of the fourth embodiment.
Figure 15:
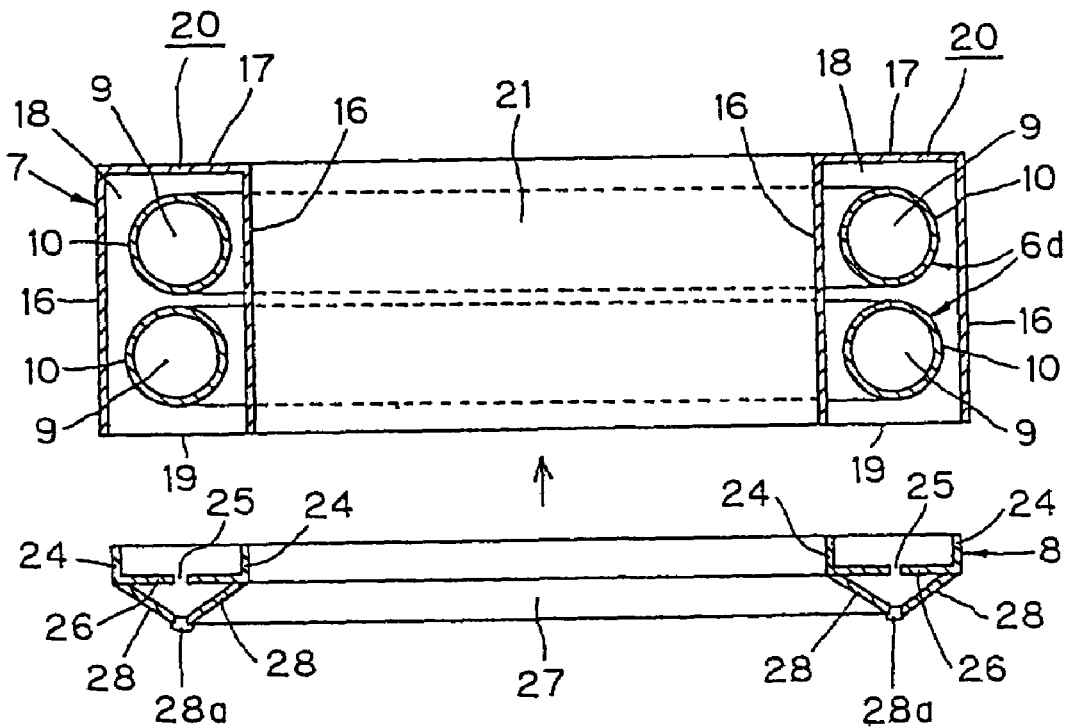
FIG. 15 is an exploded view of the clean-air injection device of the fourth embodiment.

The filter means 6d configured as discussed above is disposed in the rectangular cavity 18 of a filter case 7. The cavity 18 has a great depth so that the double rows of the cylindrically shaped filters 10 are encased in it as shown in FIGS. 14 and 15. An aperture 22 is formed in the outer side plate 16 of the case 7 so that the outwardly extending air-feed tube 15 of the I-joint 33 passes through it. Further, the guide cover 8 configured as in the first embodiment is detachably secured to the filter case 7 at its opening 19, to form the clean-air injection device 1d as shown in FIG. 16. In FIG. 16 the number 23 denotes sealing applied to the junction of the air-feed tube 15 and the aperture 22 of the filter case 7.

One function of the fourth embodiment that differs from the first embodiment is that it can increase the air to be injected by increasing the area of the filters. The other functions of it are the same in the first embodiment, and thus the description for them is omitted.

Figure 17:
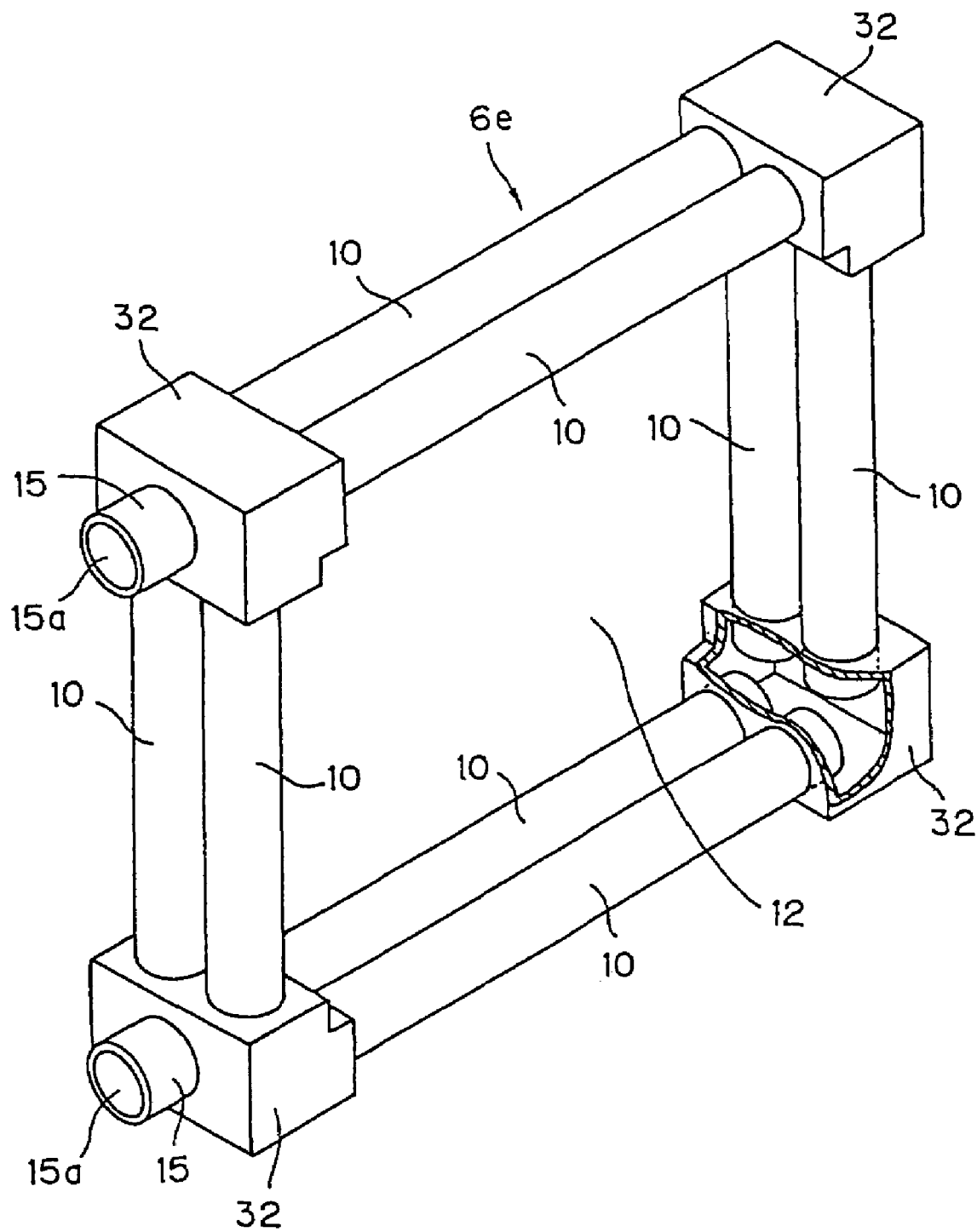
FIG. 17 is a partly sectional perspective view of a clean-air injection device of a fifth embodiment of the semiconductor-fabrication equipment of a minienvironment system of the present invention, adapted to be attached to the periphery of the opening of the loading part, wherein a part of filter means of the clean-air injection device is cut away.

FIG. 17 is a perspective view of filter means 6e of a clean-air injecting device 1e of the fifth embodiment of the type to be attached to the periphery of the opening 98 of the loading part 78 of the semiconductor-manufacturing equipment of the minienvironment system of the present invention. Like the filter means 6d of the clean-air injecting device 1d of the fourth embodiment, the filter means 6e is formed as a rectangular frame by cylindrically shaped filters 10 disposed in a plurality rows (two rows in FIG. 17) and connected to each other at their ends by L-joints 32, which have an enough depth, to define rectangular double passages 9 for air and an inside space 12, which is slightly larger than the periphery of the opening 98. Further, two of the L-joints 32, located at the left or right side of the filter means 6e (the left side in FIG. 17) have air-feed pipes 15 extending laterally and having air-feed ports 15a for receiving air from the air-supply device 2.

Figure 18:
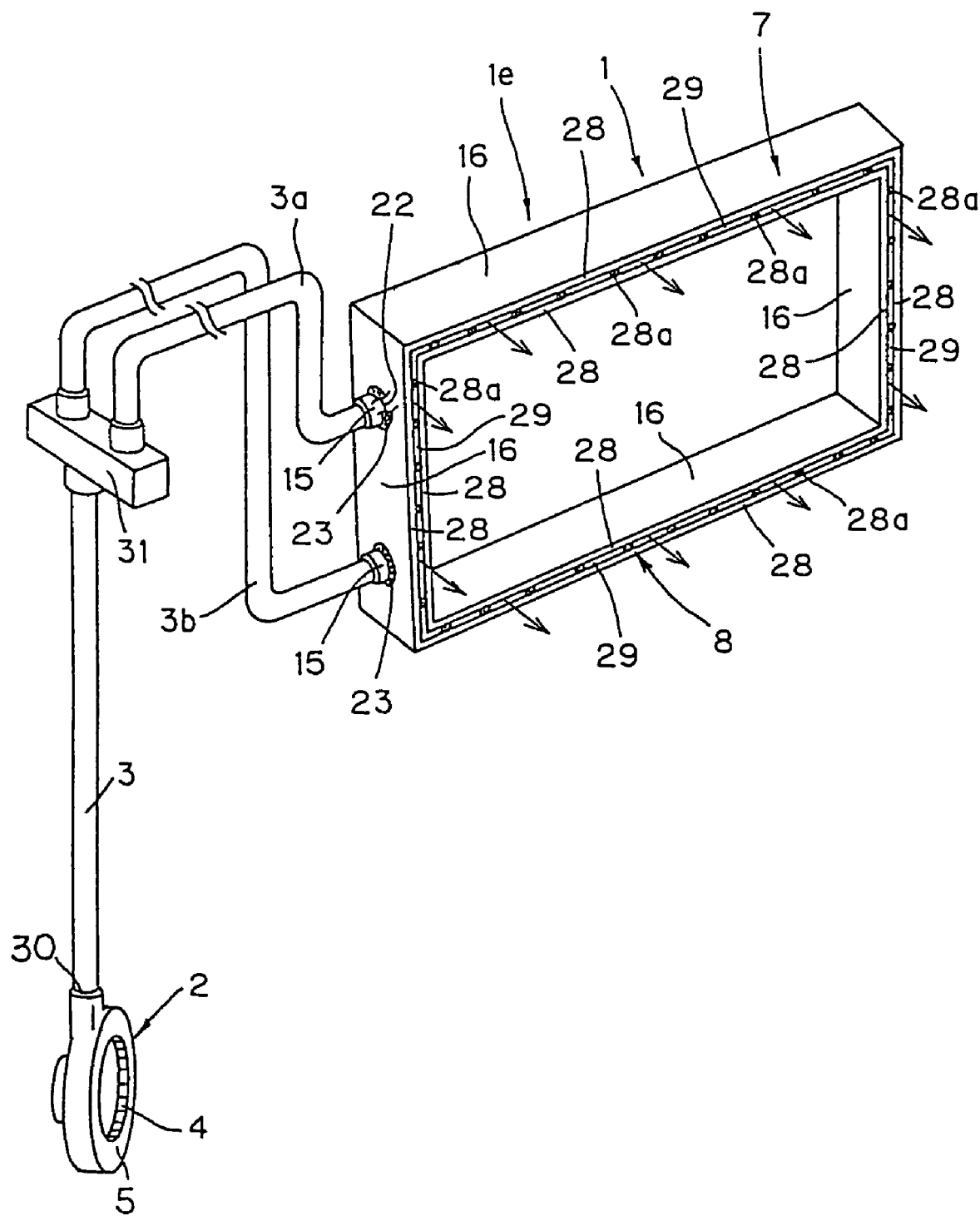
FIG. 18 is a partly sectional view of the clean-air injection device of the fifth embodiment and an air-supply device, wherein a part of the clean-air injection device is cut away.

The filter means 6e configured as discussed above is disposed in the rectangular cavity 18 of a filter case 7. The cavity 18 has a depth greater than that of the cavity 18 of the filter case 7 of the first embodiment and is configured the same as the cavity 18 of the filter case 7 in FIGS. 14 and 15, so that the double rows of the cylindrically shaped filters 10 are encased in it. Apertures 22 are formed in the outer side plate 16 of the case 7 so that the outwardly extending air-feed tubes 15 of the two L-joints 32 pass through them. Further, the guide cover 8 configured as in the first embodiment is detachably secured to the filter case 7 at its opening 19, to form the clean-air injection device 1e as shown in FIG. 18. In FIG. 18 the number 23 denotes sealing applied to the junctions of the air-feed tubes 15 and the apertures 22 of the filter case 7.

Differing from the clean-air injection device 1d of the fourth embodiment, the clean-air injection device 1e of the fifth embodiment has the two air-feed ports 15a to receive air from the air-supply device 2. Accordingly, the air supply tube 3, which is connected to the air-supply device 2 at one end, is branched to two sub-air-supply tubes 3a, 3b, which are in turn connected to the air-feed tubes 15. Using the clean-air injection device 1e of the fifth embodiment can cause the air to be more uniformly injected from the injection slit 25 and can give a greater flow rate of the air injected from it than using the clean-air injection device 1d of the fourth embodiment. The other functions of it are the same as the clean-air injection device 1a of the first embodiment, and thus the description for them is omitted.

Figure 19:
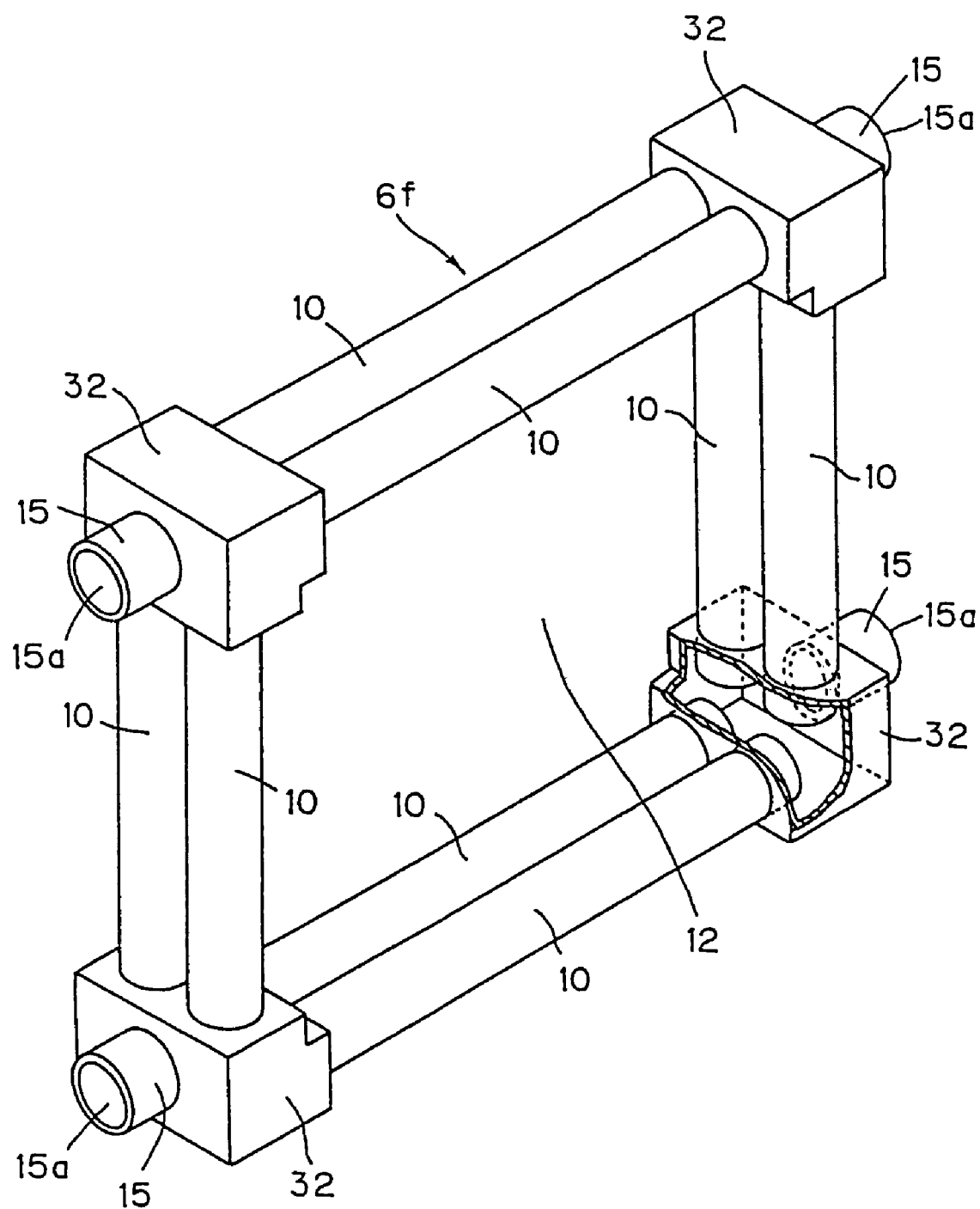
FIG. 19 is a partly sectional perspective view of a clean-air injection device of a sixth embodiment of the semiconductor-fabrication equipment of a minienvironment system of the present invention, adapted to be attached to the periphery of the opening of the loading part, wherein a part of filter means of the clean-air injection device is cut away.

FIG. 19 is a perspective view of filter means 6f of a clean-air injecting device 1f of the sixth embodiment of the type to be attached to the periphery of the opening 98 of the loading part 78 of the semiconductor-manufacturing equipment of the minienvironment system of the present invention. Like the filter means 6d of the clean-air injecting device 1d of the fourth embodiment, the filter means 6f is formed as a rectangular frame by cylindrically shaped filters 10 disposed in a plurality rows (two rows in FIG. 19) and connected to each other at their ends by L-joints 32, which have an enough depth, to define rectangular double passages 9 for air and an inside space 12, which is slightly larger than the periphery of the opening 98. Further, each L-joints 32 has an air-feed pipe 15 extending laterally and having an air-feed port 15a for receiving air from the air-supply device 2.

Figure 20:
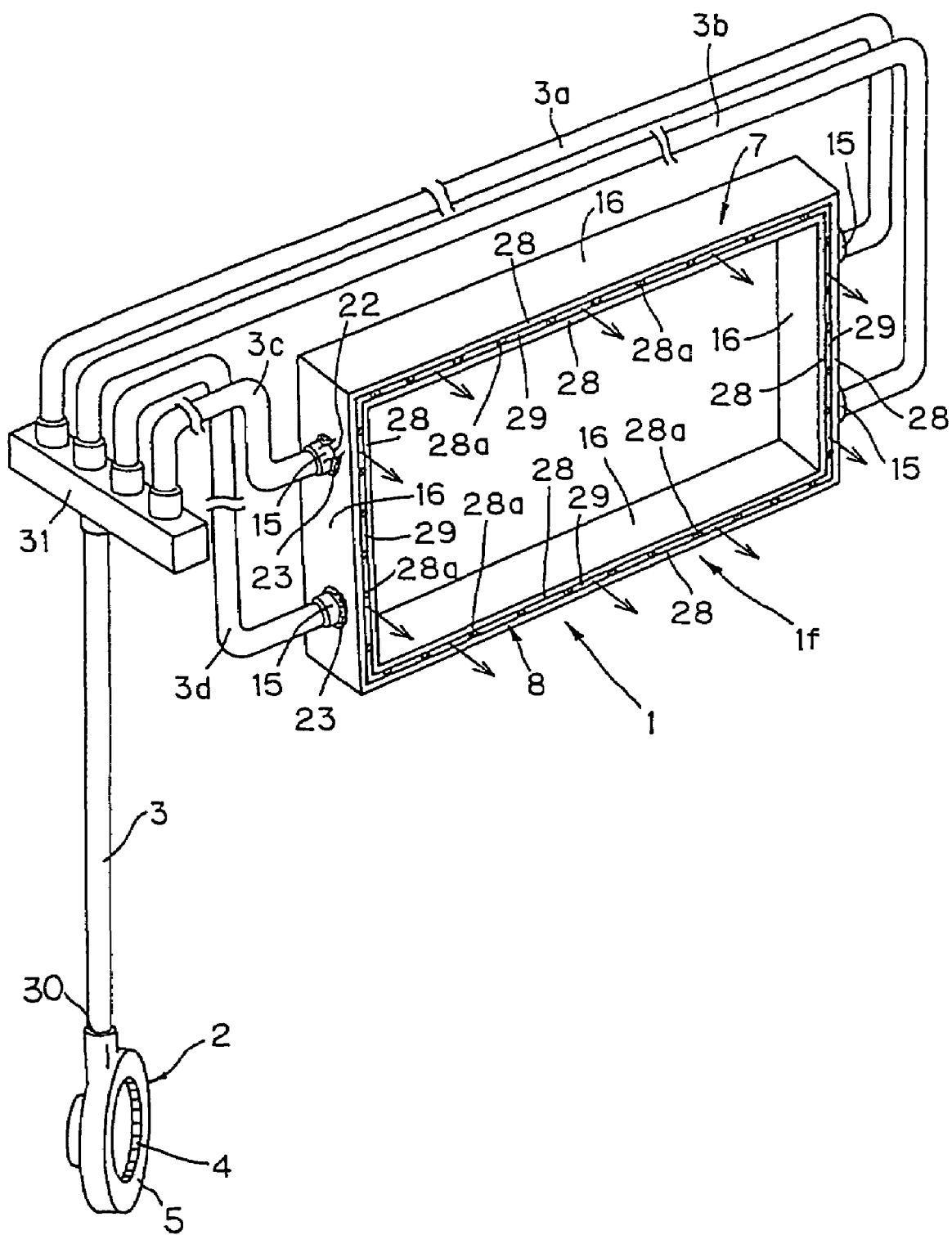
FIG. 20 is a partly sectional, schematic perspective view of the clean-air injection device of the sixth embodiment and an air-supply device, wherein a part of the clean-air injection device is cut away.

The filter means 6f configured as discussed above is disposed in the rectangular cavity 18 of a filter case 7. The cavity 18 has a depth greater than that of the cavity 18 of the filter case 7 of the first embodiment and is configured the same as the cavity 18 of the filter case 7 in FIGS. 14 and 15, so that the double rows of the cylindrically shaped filters 10 are encased in it. Apertures 22 are formed in the outer side plates 16 of the case 7 so that each outwardly extending air-feed tube 15 of the L-joints 32 passes through the corresponding aperture. Further, the guide cover 8 configured as in the first embodiment is detachably secured to the filter case 7 at its opening 19, to form the clean-air injection device 1f as shown in FIG. 20. In FIG. 20 the number 23 denotes sealing applied to each junction of each air-feed tube 15 and the corresponding aperture 22 of the filter case 7.

Differing from the clean-air injection device 1e of the fifth embodiment, the clean-air injection device 1f of the sixth embodiment has the four air-feed ports 15a to receive air from the air-supply device 2. Accordingly, the air supply tube 3, which is connected to the air-supply device 2 at one end, is branched to four sub-air-supply tubes 3a, 3b, 3c, and 3d, which are in turn connected to the air-feed tubes 15. Using the clean-air injection device 1f of the sixth embodiment can cause the air to be more uniformly injected from the injection slit 25 and can give a greater flow rate of the air injected from it than using the clean-air injection device 1e of the fifth embodiment. The other functions of it are the same as the clean-air injection device 1a of the first embodiment, and thus the description for them is omitted.

Figure 21:
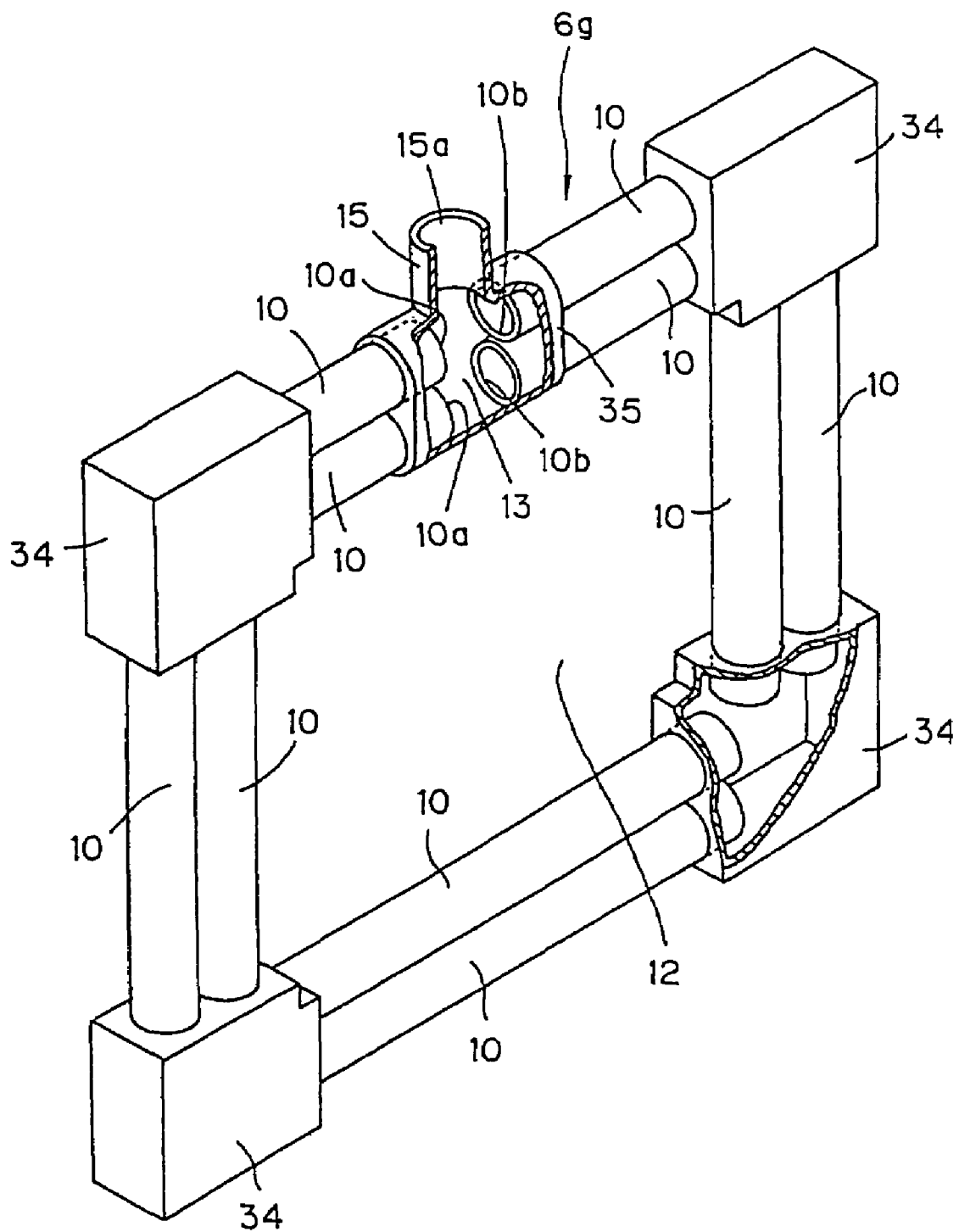
FIG. 21 is a partly sectional perspective view of a clean-air injection device of a seventh embodiment of the semiconductor-fabrication equipment of a minienvironment system of the present invention, adapted to be attached to the periphery of the opening of the loading part, wherein a part of filter means of the clean-air injection device is cut away.
Figure 24:
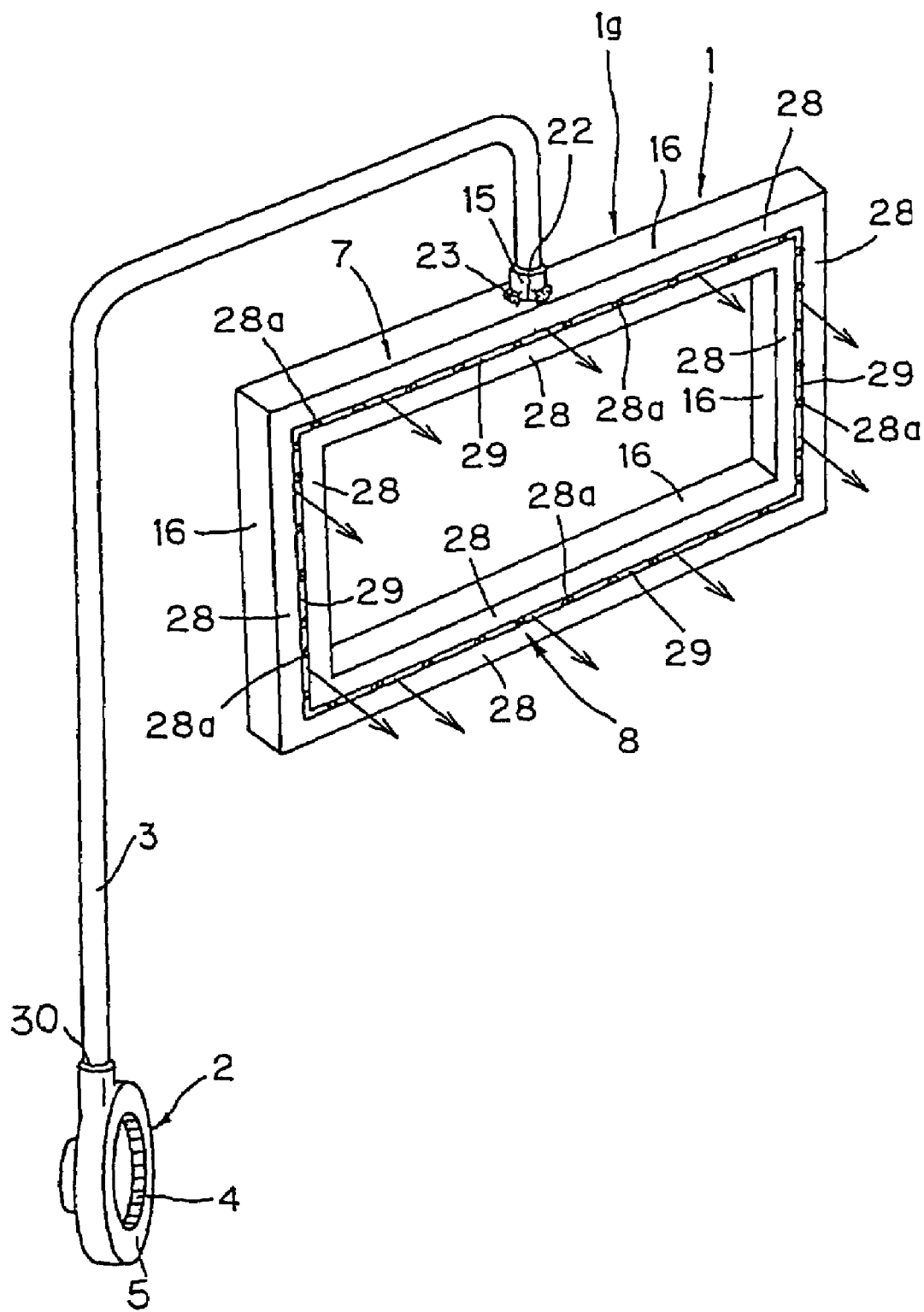
FIG. 24 is a partly sectional, schematic perspective view of the clean-air injection device of the seventh embodiment and an air-supply device, wherein a part of the clean-air injection device is cut away.

FIG. 21 is a perspective view of filter means 6g of a clean-air injecting device 1g of the seventh embodiment of the type to be attached to the periphery of the opening 98 of the loading part 78 of the semiconductor-manufacturing equipment of the minienvironment system of the present invention. Like the first embodiment, the clean-air injecting device 1g, which is provided with the filter means 6g, is connected to the air-supply device 2 through an air-supply tube 3 as shown in FIG. 24. Further, the filter means 6g differs from the filter means 6d of the clean-air injection device 1d of the fourth embodiment in that the filter means 6g is formed as a rectangular frame by cylindrically shaped filters 10 disposed in a plurality of rows in the directions of their width (two rows in FIG. 21), while the cylindrically shaped filters 10 of the fourth embodiment are disposed in rows in the direction of their depth.

The clean-air supply device 1g of the seventh embodiment may be used when the air to be injected is increased by enlarging the area of the filters, or when the width and height of the filter case can be great, but its depth must be less. In this embodiment the cylindrically shaped filters 10 are disposed in rows in the direction of their width (or height) to increase the area of the filters to increase the air to be injected.

More specifically, the filter means 6g is formed as a rectangular frame by the cylindrically shaped filters 10 disposed in rows in the direction of their widths and jointed at their ends by L-joints 34, which have enough widths, to define rectangular double passages 9 for air and an inside space 12, which is slightly larger than the periphery of the opening 98. The central parts of the upper or lower set of lateral filters 10 (the upper set in FIG. 21) are cut away to create a spacing part 13 between the cut ends 10a and 10b, and the cut ends 10a, 10b are connected by a I-joint 35, which has an enough width (height). The I-joint 35 is formed with an air-feed tube 15, which extends upwardly, and which has an air-feed port 15a for receiving air from the air-supply device 2.

Figure 22:
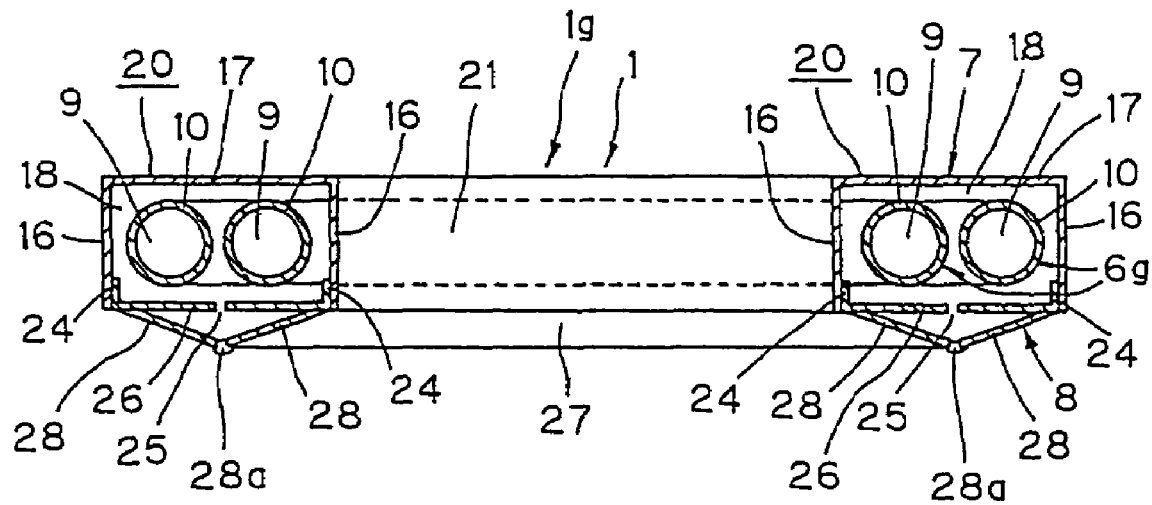
FIG. 22 is a cross-sectional view of the clean-air injection device of the seventh embodiment.
Figure 23:
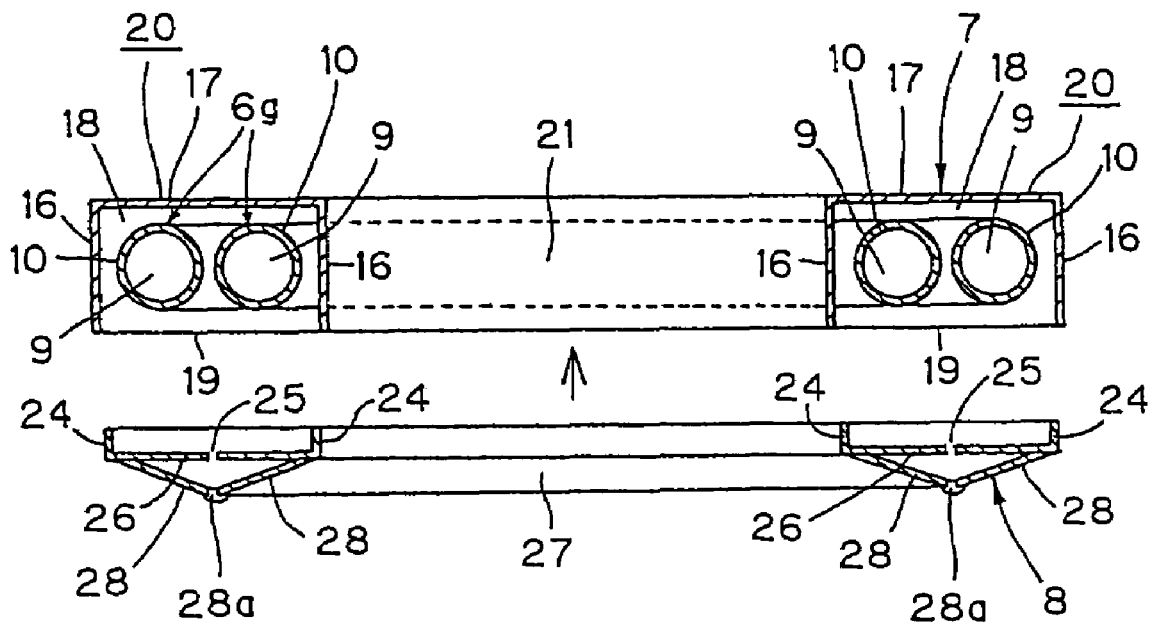
FIG. 23 is an exploded view of the clean-air injection device of the seventh embodiment.

The filter means 6g configured as discussed above is disposed in the rectangular cavity 18 of a filter case 7. The cavity 18 has a width greater than that of the cavity 18 of the filter case 7 of the first embodiment as shown in FIGS. 22 and 23, so that the rows of the cylindrically shaped filters 10 are encased in it. An aperture 22 is formed in the outer side plate 16 of the case 7 so that the outwardly extending air-feed tube 15 of the I-joint 35 passes through the aperture 22. Further, the guide cover 8 configured as in the first embodiment is detachably secured to the filter case 7 at its opening 19, to form the clean-air injection device 1g as shown in FIG. 24. In FIG. 24 the number 23 denotes sealing applied to the junction of the air-feed tube 15 and the aperture 22 of the filter case 7.

One function in the seventh embodiment that differs from that of the first embodiment is to increase the air to be injected by increasing the area of the filters. Since the other functions of it are the same as the first embodiment, the description for them is omitted.

Figure 25:
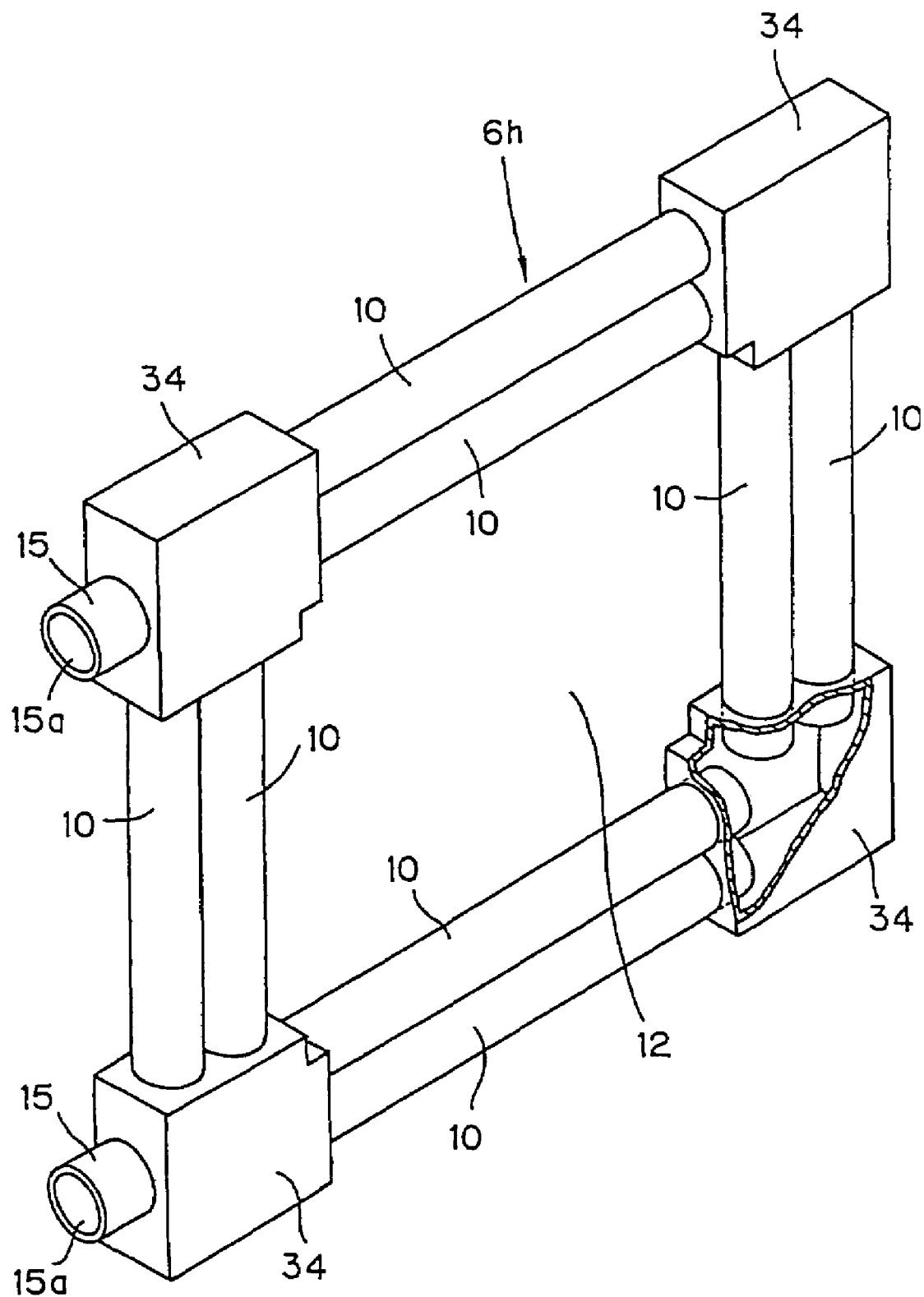
FIG. 25 is a partly sectional perspective view of a clean-air injection device of a eighth embodiment of the semiconductor-fabrication equipment of a minienvironment system of the present invention, adapted to be attached to the periphery of the opening of the loading part, wherein a part of filter means of the clean-air injection device is cut away.

FIG. 25 is a perspective view of filter means 6h of a clean-air injecting device 1h of the eighth embodiment of the type to be attached to the periphery of the opening 98 of the loading part 78 of the semiconductor-manufacturing equipment of the minienvironment system of the present invention. Like the filter means 6g of the clean-air injection device 1g of the seventh embodiment, the filter means 6h is formed as a rectangular frame by cylindrically shaped filters 10 disposed in rows in the direction of their width (two rows in FIG. 25) and connected at their ends by L-joints 34, which have enough widths, to form double passages 9 for air and an inside space 12, which is slightly larger than the periphery of the opening 98. The two of the L-joints 34, located at the left or right of the filter means (at the left in FIG. 25), have air-feed tubes 15 extending laterally and having air-feed ports 15a for receiving air from the air-supply device 2.

Figure 26:
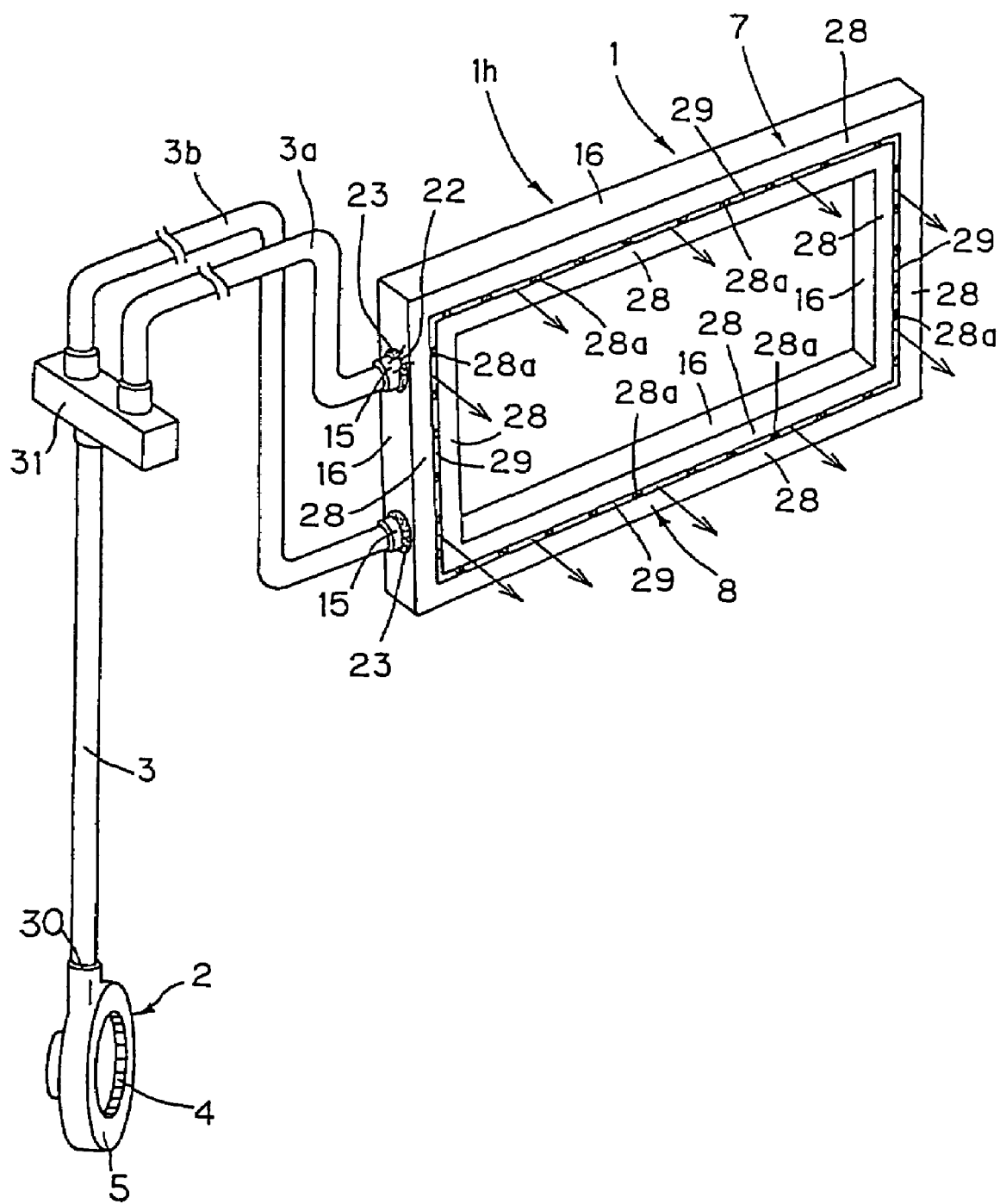
FIG. 26 is a partly sectional, schematic perspective view of the clean-air injection device of the eighth embodiment and an air-supply device, wherein a part of the clean-air injection device is cut away.

The filter means 6h configured as discussed above is disposed in the rectangular cavity 18 of a filter case 7. The cavity 18 has a width greater than that of the cavity 18 of the filter case 7 of the first embodiment as shown in FIGS. 22 and 23, so that the rows of the cylindrically shaped filters 10 are encased in it. Apertures 22 are formed in the outer side plate 16 of the case 7 so that the outwardly extending air-feed tubes 15 of the L-joints 34 pass through the apertures 22. Further, the guide cover 8 configured as in the first embodiment is detachably secured to the filter case 7 at its opening 19, to form the clean-air injection device 1h as shown in FIG. 26. In FIG. 26 the number 23 denotes sealing applied to the junctions of the air-feed tubes 15 and the apertures 22 of the filter case 7.

Differing from the clean-air injection device 1g of the seventh embodiment, the clean-air injection device 1h of the eighth embodiment has the two air-feed ports 15a for receiving air from the air-supply device 2. Accordingly, as in FIG. 26 the air-supply tube 3, which is connected to the air-supply device 2 at one end, is branched to two sub-air-supply tubes 3a, 3b through a branching box 31, and the tubes 3a, 3b are in turn connected to the air-feed tubes 15.

Using the clean-air injection device 1h of the eighth embodiment can cause the air to be more uniformly injected from the injection slit 25 and can give a greater flow rate of the air injected from it than using the clean-air injection device 1g of the seventh embodiment. The other functions of it are the same as the clean-air injection device 1a of the first embodiment, and thus the description for them is omitted.

Figure 27:
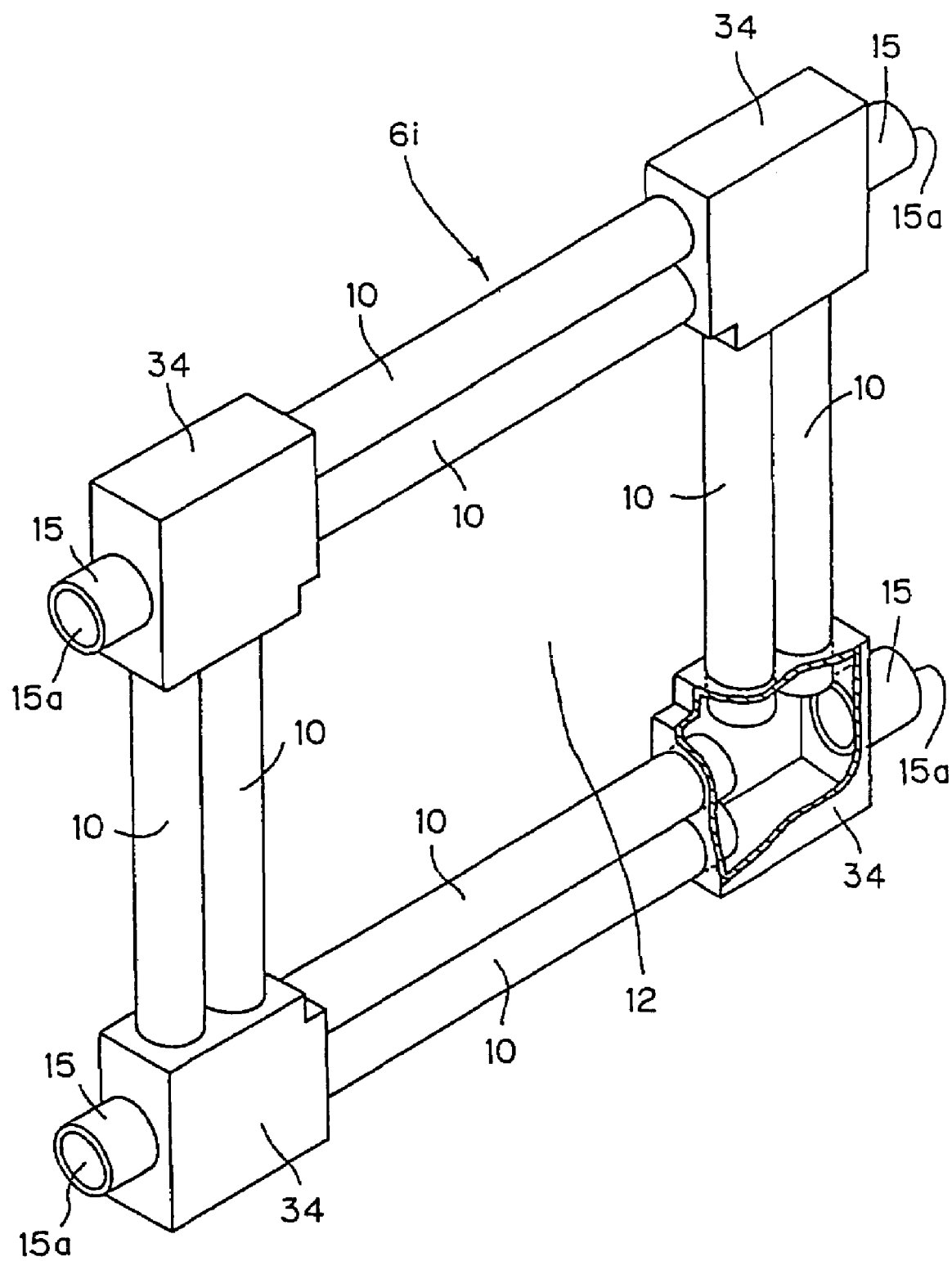
FIG. 27 is a partly sectional perspective view of a clean-air injection device of a ninth embodiment of the semiconductor-fabrication equipment of a minienvironment system of the present invention, adapted to be attached to the periphery of the opening of the loading part, wherein a part of filter means of the clean-air injection device is cut away.

FIG. 27 is a perspective view of filter means 6i of a clean-air injecting device 1i of the ninth embodiment of the type to be attached to the periphery of the opening 98 of the loading part 78 of the semiconductor-manufacturing equipment of the minienvironment system of the present invention. Like the filter means 6g of the clean-air injection device 1g of the seventh embodiment, the filter means 6i is formed as a rectangular frame by cylindrically shaped filters 10 disposed in rows in the direction of their width (two rows in FIG. 27) and connected at their ends by L-joints 34, which have enough widths, to form double passages 9 for air and an inside space 12, which is slightly larger than the periphery of the opening 98. Each L-joint 34 has an air-feed tube 15 extending laterally and having an air-feed port 15a for receiving air from the air-supply device 2.

Figure 28:
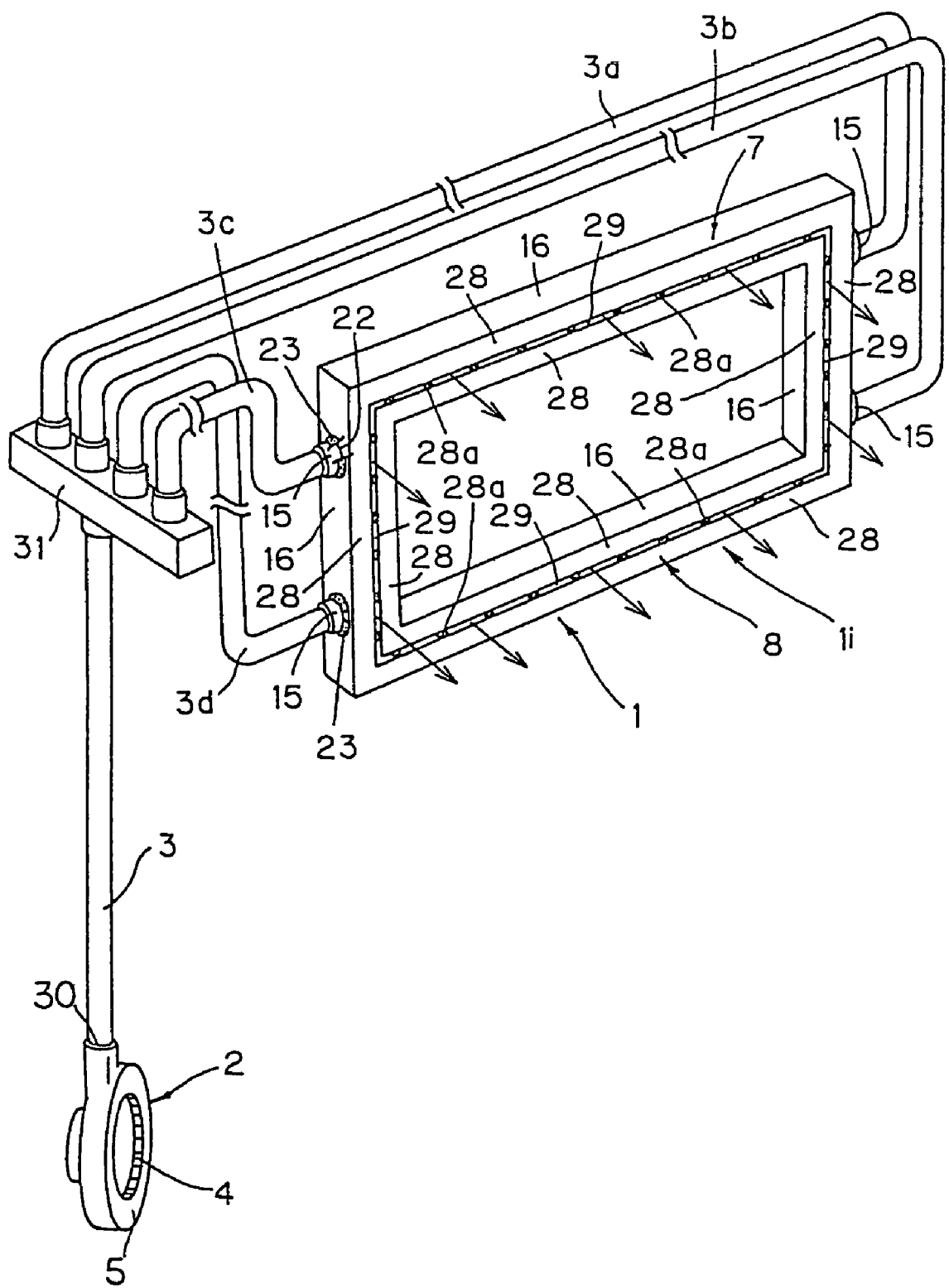
FIG. 28 is a partly sectional, schematic perspective view of the clean-air injection device of the ninth embodiment and an air-supply device, wherein a part of the clean-air injection device is cut away.

The filter means 6i configured as discussed above is disposed in the rectangular cavity 18 of a filter case 7. The cavity 18 has a width greater than that of the cavity 18 of the filter case 7 of the first embodiment as shown in FIGS. 22 and 23, so that the rows of the cylindrically shaped filters 10 are encased in it. Apertures 22 are formed in the outer side plates 16 of the case 7 so that the outwardly extending air-feed tubes 15 of the L-joints 34 pass through the apertures 22. Further, the guide cover 8 configured as in the first embodiment is detachably secured to the filter case 7 at its opening 19, to form the clean-air injection device 1i as shown in FIG. 28. In FIG. 28 the number 23 denotes sealing applied to the junctions of the air-feed tubes 15 and the apertures 22 of the filter case 7.

Differing from the clean-air injection device 1h of the eighth embodiment, the clean-air injection device 1i of the ninth embodiment has the four air-feed ports 15a for receiving air from the air-supply device 2. Accordingly, as in FIG. 28 the air-supply tube 3, which is connected to the air-supply device 2 at one end, is branched at its intermediate part to four sub-air-supply tubes 3a, 3b, 3c, 3d through a branching box 31, and the tubes 3a, 3b, 3c, 3d are in turn connected to the air-feed tubes 15.

Using the clean-air injection device 1i of the ninth embodiment can cause the air to be more uniformly injected from the injection slit 25 and can give a greater flow rate of the air injected from it than using the clean-air injection device 1h of the eighth embodiment. The other functions of it are the same as the clean-air injection device 1a of the first embodiment, and thus the description for them is omitted.

According to the semiconductor-fabrication equipment of the minienvironment system of the present invention provided with the clean-air injection device discussed above of the type to be attached to the periphery of the opening of the loading part, when the lid 75 of the hermetic container 71 is opened into the semiconductor-fabrication equipment and a wafer 73 is taken out by the arm 93, or when a processed wafer is put in the hermetic container 71 by the arm 93, the clean air injected form the injection slit 25 of the clean-air injection device 1 connected to the air-supply device 2 through the air-supply tube 3 is injected from the guide slit 29 as shown by straight lines (in FIGS. 1 and 2) to form an air curtain at the gap 96 between the opening 98 and the gateway 74, to prevent the dust-entrained ambient air from passing through the gap into the hermetic container 71 as shown in the curbed arrows (in FIGS. 1 and 2). Thus the dust is prevented from adhering to the wafers 73 of the hermetic containers 71.

Figure 29:
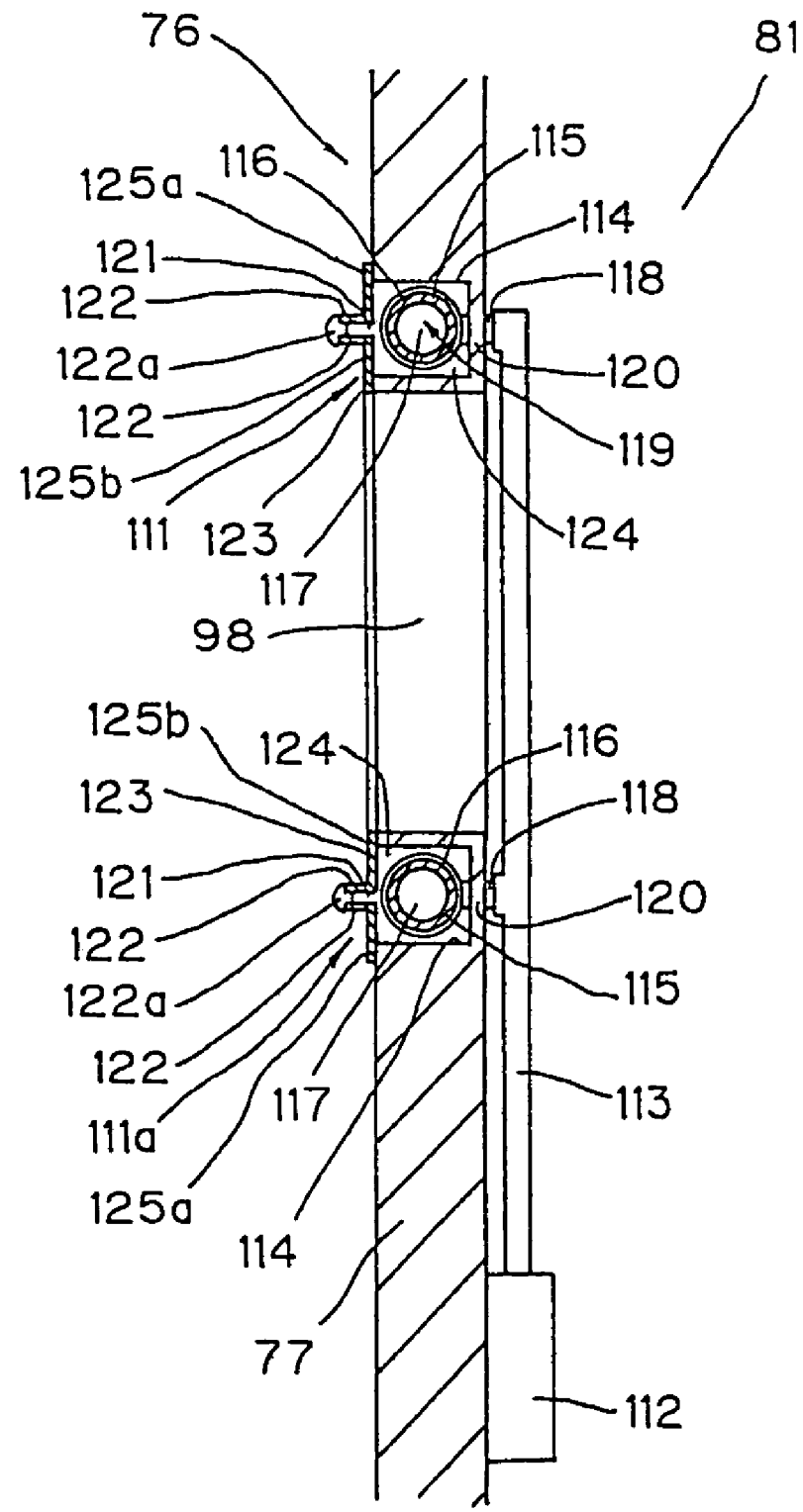
FIG. 29 is a schematic sectional view of the main part of the semiconductor-fabrication equipment of a minienvironment system of the invention provided with the clean-air injection device of the first embodiment.
Figure 30:
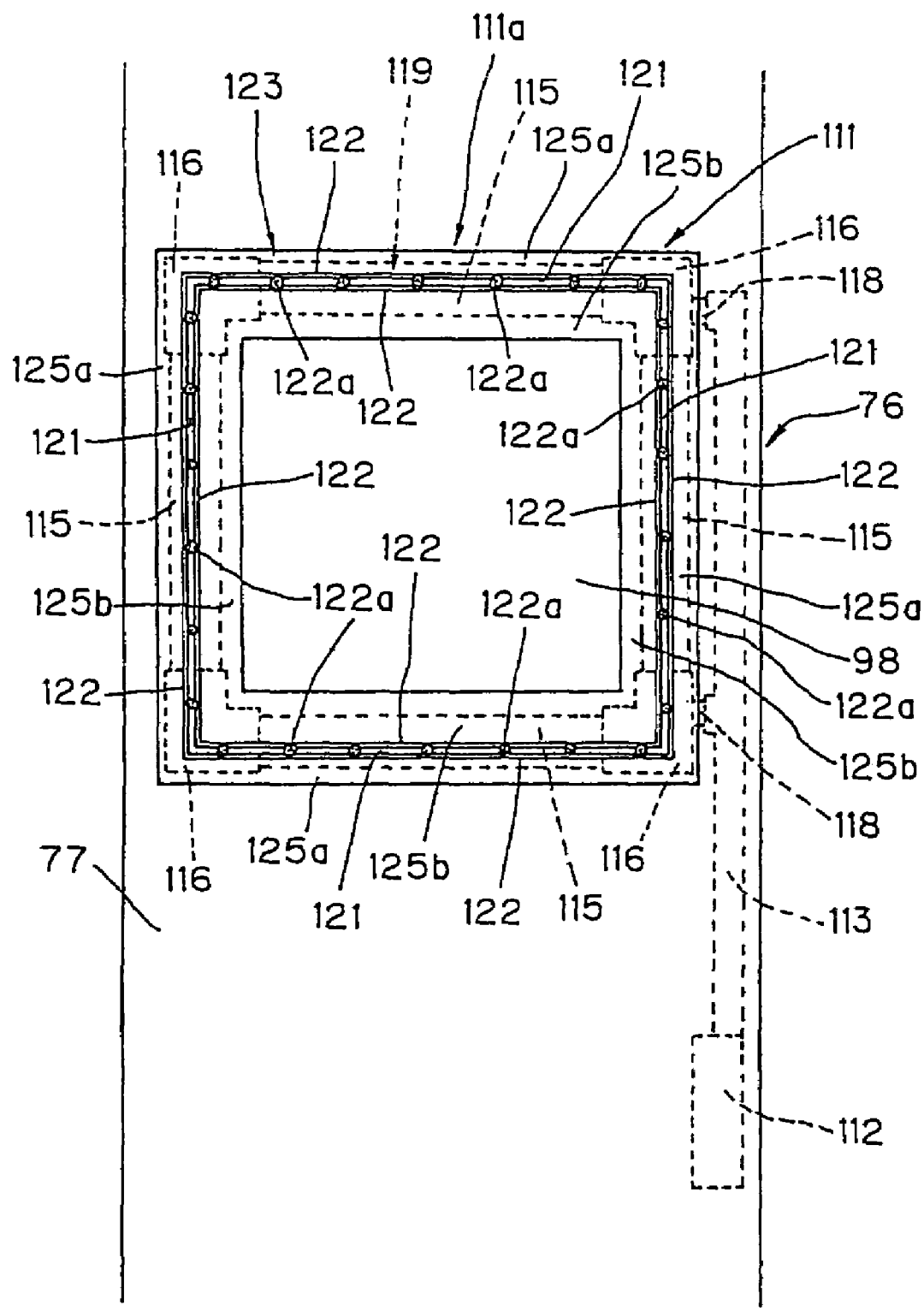
FIG. 30 is a schematic front view of the main part of FIG. 29, taken from the loading side.

FIG. 29 is a schematic sectional view of the main part of the semiconductor-fabrication equipment of the minienvironment system provided with a clean-air injection device embedded in the periphery of the opening 98 of the loading part 78, wherein a clean-air injection device 111a of the first embodiment is used. FIG. 30 is a schematic front view taken from the loading part side. The clean-air injection device 111a of the first embodiment is embedded in the periphery of the opening 98 of the loading part 78, formed in the front panel 77 of the semiconductor-fabrication device 76.

That is, like the clean-air injection device 1 attached to the periphery of the opening 98 of the loading part 78 as shown in FIGS. 1 and 2, the clean-air injection device 111a of the first embodiment is connected through the air-supply tube 113 to the air-supply device 112 mounted on the inner surface of the front panel 77 for sucking air in the high cleanliness space 81. Further, in the clean-air injection device 111a a rectangular, concave notch 114 is formed at the periphery of the opening 98 of the front panel 77. The concave notch 114 is opened toward the loading part. Filter means 119 is formed as in FIG. 9, where the cylindrically shaped filters 115 are connected at their ends by the L-joints 116, to define a rectangular air passage 117, and two L-joints 116 located at one side are formed with air-feed tube 118 extending laterally for receiving air from the air-supply device 112. The filter means 119 is placed in the notch 114.

Further, in the clean-air injection device 111a each air-feed tube 118 passes through a rear plate 120 of the notch 114 into the high cleanliness space 81 and is connected there to the air-supply tube 113. A cover 123, which is formed as a rectangular frame, is mounted on the front of the notch 114. The cover 123 has guide plates 122 angled to guide air and to define a slit 121 between the angled protruding portions along the rectangular frame. Thus an air space 124 is defined around the filter means 119. The slit 121 is located at the center of the rectangular frame for injecting clean air that has passed the filter means 119. The size (width) of the slit may not be limited to a special size. It is preferably 1.5 mm.

In FIGS. 29 and 30 the number and letter 122a denotes spot welding, which are applied between the guide plates 122 at the spacing of about 5 cm to joint them so that they cannot be separated into two cover members 125a, 125b.

According to the semiconductor-fabrication equipment of the minienvironment system of the present invention that uses the clean-air injection device 111a configured as discussed above, when the air in the high cleanliness space 81 is pumped to the filer means 119 from the air-supply device 2 through the air-supply tube 113, the air is pumped into the air passage 117 of the cylindrically shaped filters 115 of the filter means 119 and is filtered by the filters 115 to become more clean than the air in the in the high cleanliness space 81, and the more clean air injected into the air space 124 is then injected from the injection slit 121. The other functions are the same as those in the semiconductor-fabrication equipment of the present invention that uses the clean-air injection device 1. Thus the description for them is omitted.

Figure 31:
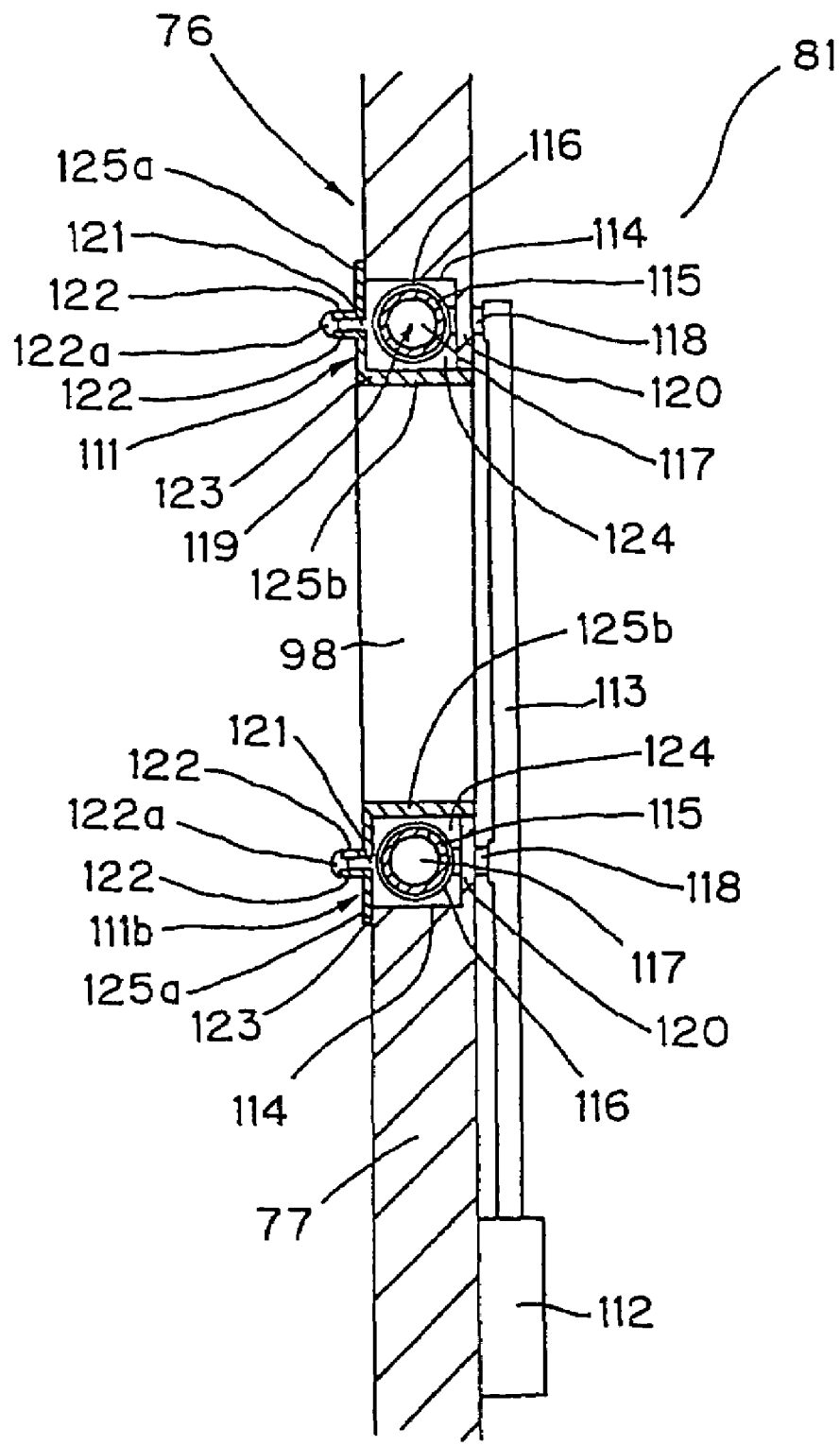
FIG. 31 is a schematic sectional view of the main part of the semiconductor-fabrication equipment of a minienvironment system of the invention provided with the clean-air injection device of the second embodiment.
Figure 32:
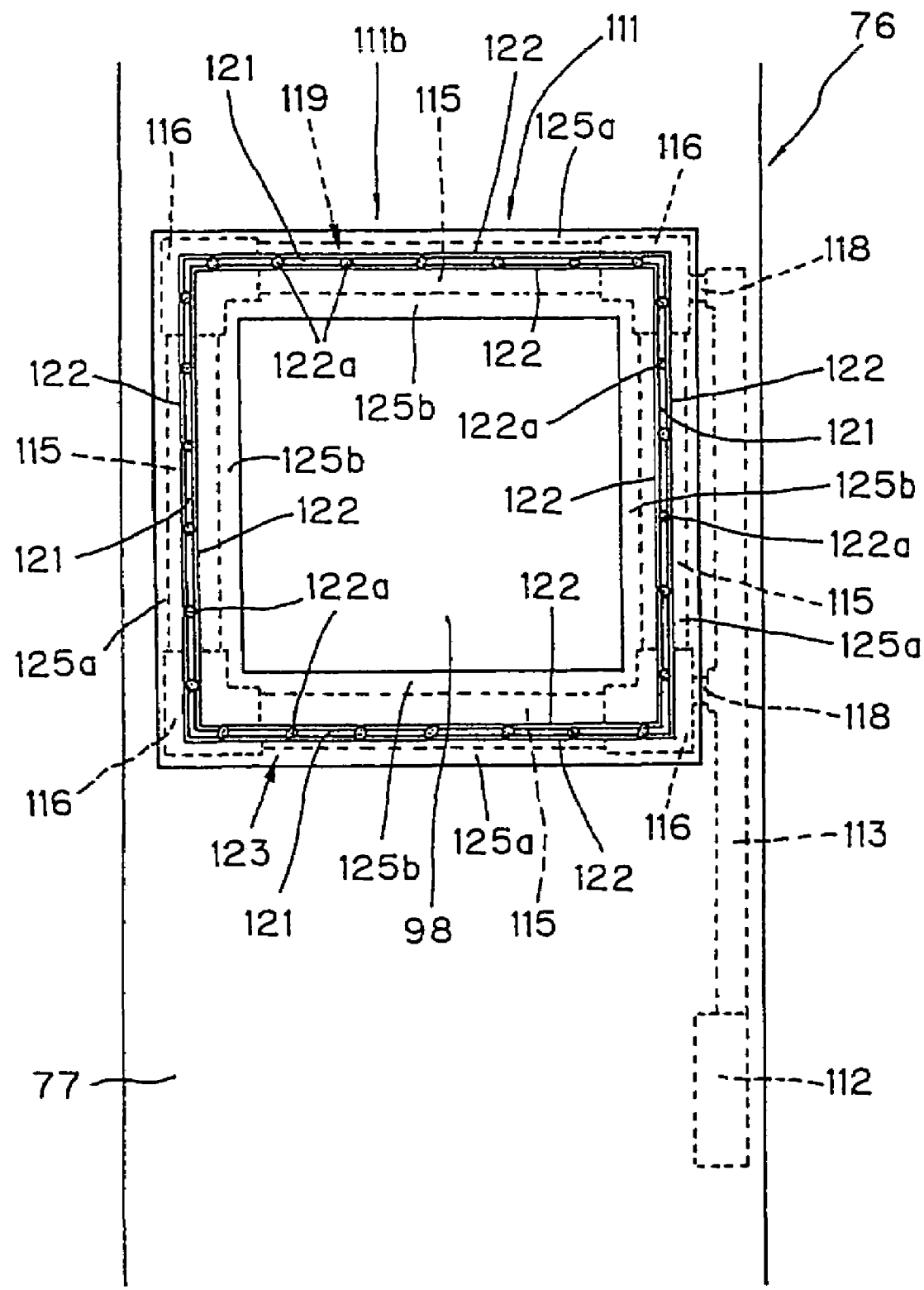
FIG. 32 is a schematic front view of the main part of FIG. 31, taken from the loading side.

FIG. 31 is a schematic sectional view of the main part of the semiconductor-fabrication equipment of the minienvironment system provided with a clean-air injection device embedded in the periphery of the opening 98 of the loading part 78, wherein a clean-air injection device 111b of the second embodiment is used. FIG. 32 is a schematic front view taken from the loading part side. The clean-air injection device 111b of the second embodiment is embedded in the periphery of the opening 98 of the loading part 78, like the clean-air injection device 111a of the first embodiment.

Further, the clean-air injection device 111b of the second embodiment differs from the clean-air injection device 111a of the first embodiment in the shapes of a notch 114 and a cover 123, and the other structures of it are the same as those of the clean-air injection device 111a of the first embodiment.

That is, like the clean-air injection device 111a of the first invention, the clean-air injection device 111b of the second embodiment is connected through the air-supply tube 113 to the air-supply device 112 mounted on the inner surface of the front panel 77 for sucking air in the high cleanliness space 81. Further, in the clean-air injection device 111a a rectangular (annular), hook-shaped notch 114 is formed at the periphery of the opening 98 of the front panel 77. The notch 114 is opened toward the loading part. Filter means 119 is formed as in FIG. 9, where the cylindrically shaped filters 115 are connected at their ends by the L-joints 116, to define a rectangular air passage 117, and two L-joints 116 located at one side are formed with air-feed tube 118 extending laterally for receiving air from the air-supply device 112. The filter means 119 is placed in the notch 114.

Further, in the clean-air injection device 111b each air-feed tube 118 passes through a rear plate 120 of the notch 114 into the high cleanliness space 81 and is connected there to the air-supply tube 113. A cover 123, which has a hook-shaped cross section, and which is formed as a rectangular frame, is mounted on the front of the notch 114. The cover 123 has guide plates 122 angled to guide air and to define a slit 121 between the angled protruding portions along the rectangular frame. Thus an air space 124 is defined around the filter means 119. The slit 121 is located at the center of the rectangular frame for injecting clean air that has passed the filter means 119. The size (width) of the slit may not be limited to a special size. It is preferably 1.5 mm.

Figure 33:
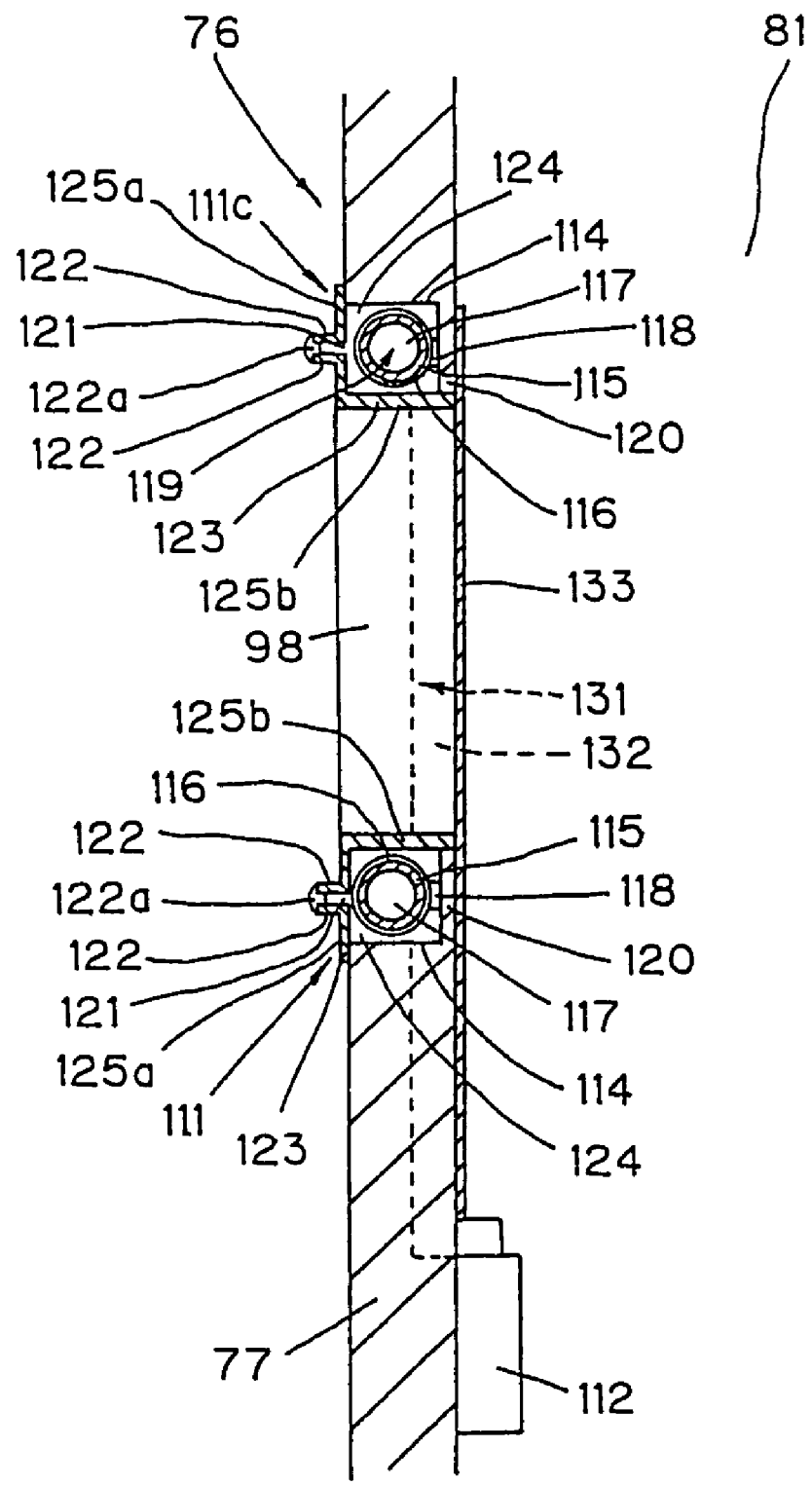
FIG. 33 is a schematic sectional view of the main part of the semiconductor-fabrication equipment of a minienvironment system of the invention provided with the clean-air injection device of the third embodiment.

In FIGS. 32 and 33 the number and letter 122a denotes spot welding, which are applied between the guide plates 122 at the spacing of about 5 cm to joint them so that they cannot be separated into two cover members 125a, 125b.

The main function of the semiconductor-fabrication equipment of the minienvironment system of the present invention that uses the clean-air injection device 111b configured as discussed above is the same as that of the system that uses the clean-air injection device 111a of the first embodiment. The other functions are the same as those in the semiconductor-fabrication equipment of the present invention that uses the clean-air injection device 1. Thus the description for them is omitted.

Figure 34:
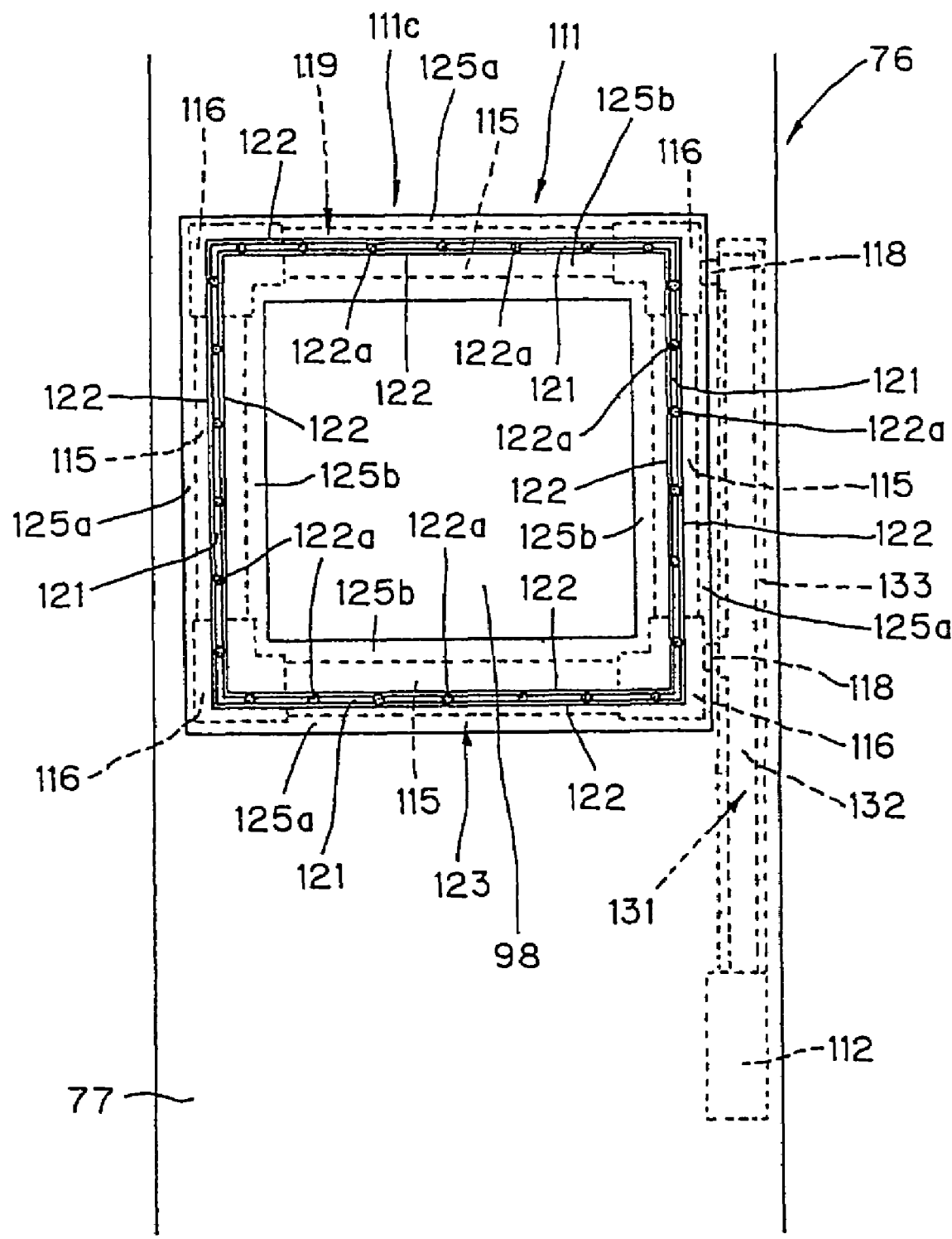
FIG. 34 is a schematic front view of the main part of FIG. 33, taken from the loading side.

FIG. 33 is a schematic sectional view of the main part of the semiconductor-fabrication equipment of the minienvironment system provided with a clean-air injection device embedded in the periphery of the opening 98 of the loading part 78, wherein a clean-air injection device 111c of the third embodiment is used. FIG. 34 is a schematic front view taken from the loading part side. The clean-air injection device 111c of the third embodiment is embedded in the periphery of the opening 98 of the loading part 78, like the clean-air injection device 111a of the first embodiment.

Further, the clean-air injection device 111c of the third embodiment differs from the clean-air injection device 111b of the second embodiment in that it does not use an air-supply tube 113, and the other structures of it are the same as those of the clean-air injection device 111b of the second embodiment.

Figure 35:
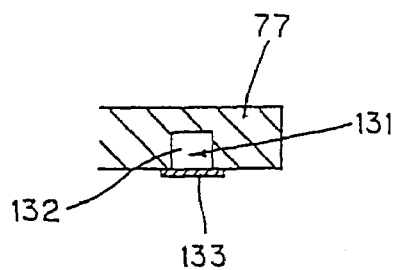
FIG. 35 is a cross-sectional view of an air-supply passage of the semiconductor-fabrication equipment of a minienvironment system provided with the clean-air injection device of the third embodiment.
Figure 36:
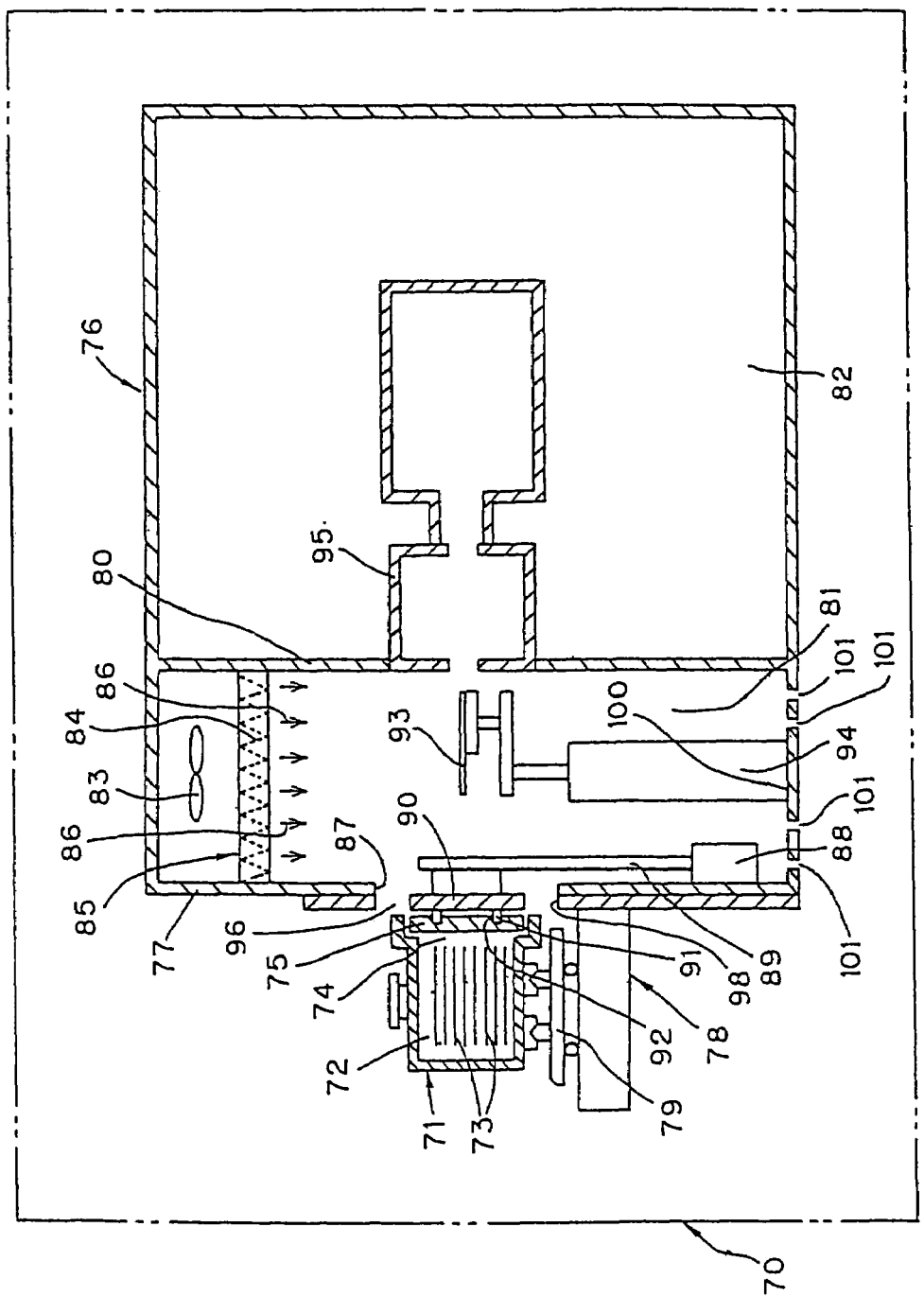
FIG. 36 is a schematic sectional view of a conventional semiconductor-fabrication equipment of a minienvironment system.
Figure 37:
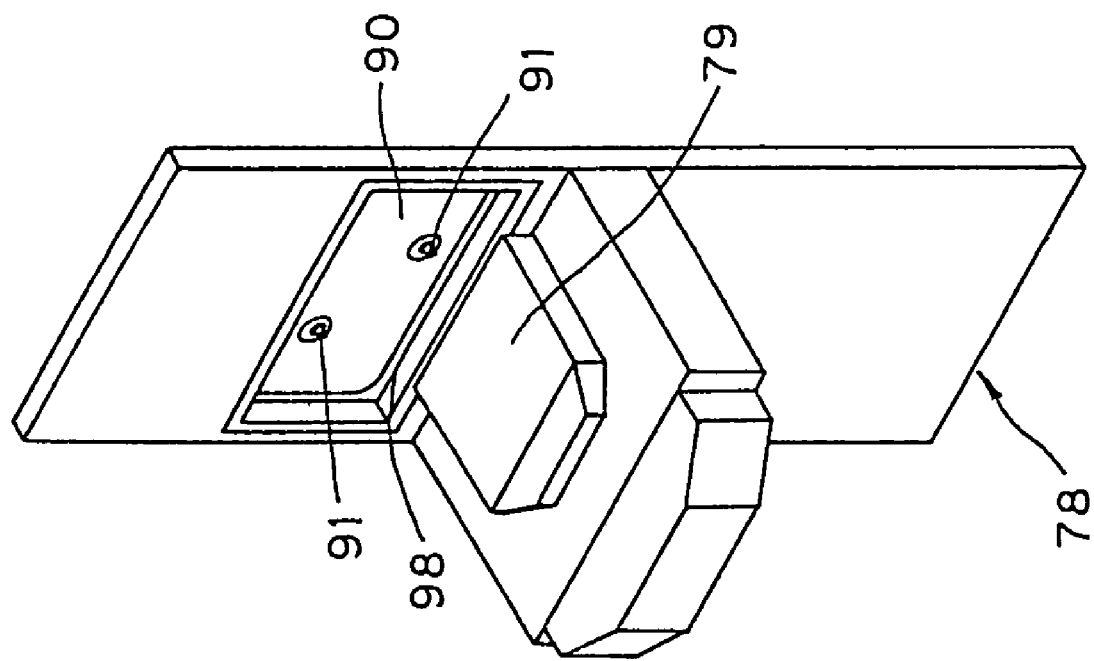
FIG. 37 is an exploded view of a hermetic container and a loading device of the conventional semiconductor-fabrication equipment of a minienvironment system.
Figure 37:
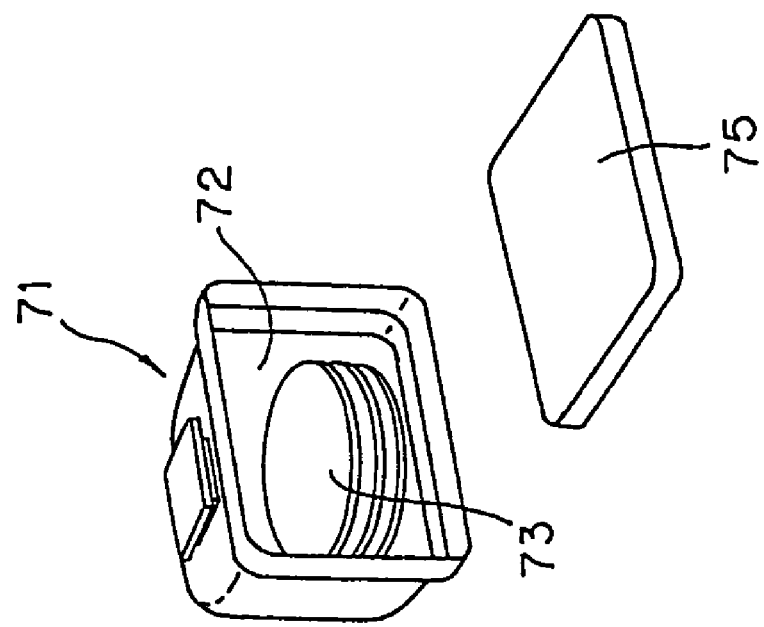
Figure 38:
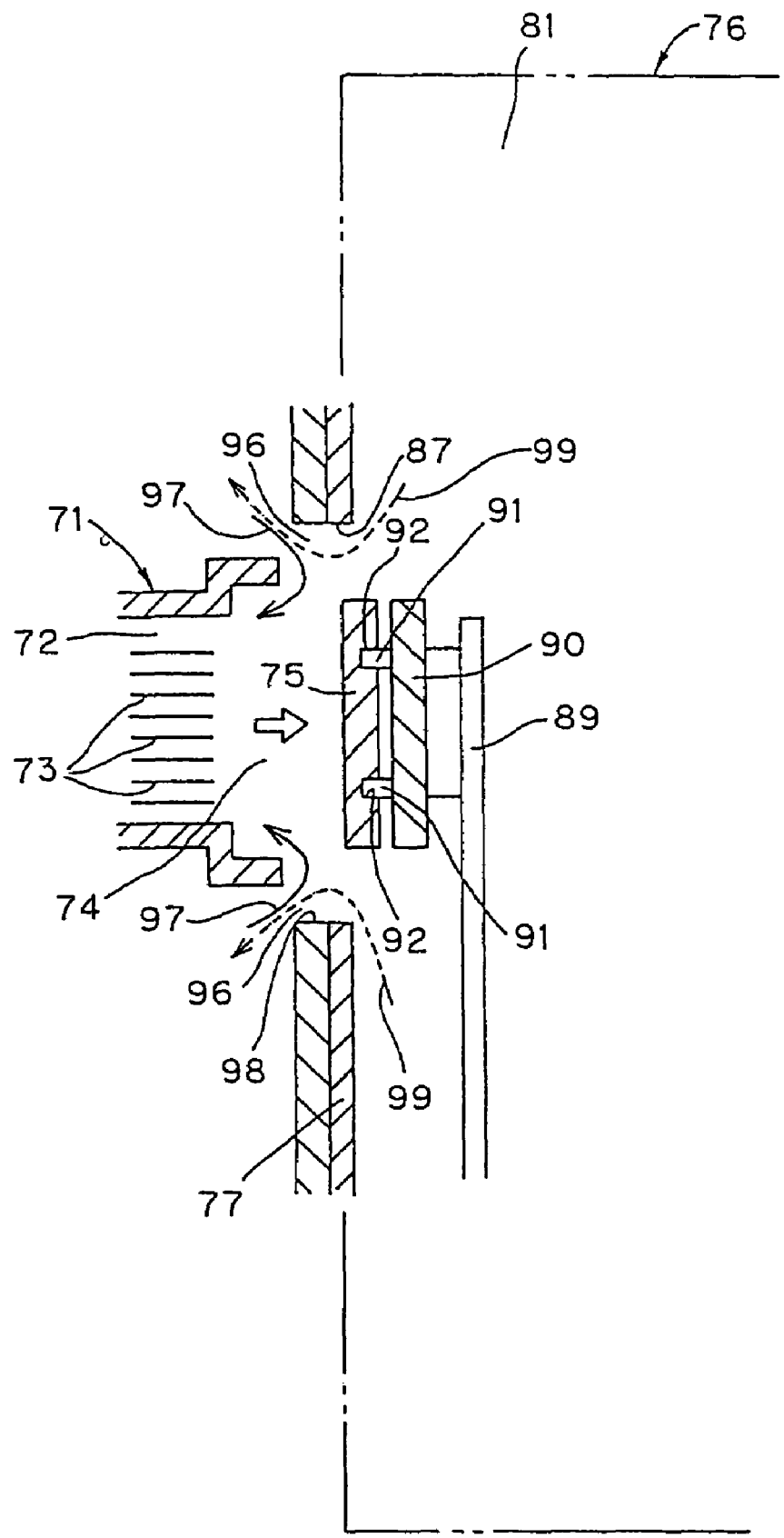
FIG. 38 is a schematic sectional view of the main part of the conventional semiconductor-fabrication equipment of a minienvironment system.

That is, the clean-air injection device 111c of the third embodiment is connected to the air-supply device 112 mounted on the inner surface of the front panel 77 for sucking air in the high cleanliness space 81 through an air-supply passage 131 disposed in the front panel 77. As shown in FIGS. 33 and 35, the air-supply passage 131 is formed as an air-supply groove 132, which is formed in the front panel 77 at the high cleanliness space 81 side, and which is covered by a cover plate 133 at the high cleanliness space 81 side. The air-supply passage 131 is in fluid communication with the air-supply device 112 and extends upwards.

Further, in the clean-air injection device 111c a rectangular (annular), hook-shaped notch 114 is formed at the periphery of the opening 98 of the front panel 77. The notch 114 is opened toward the loading part. Filter means 119 is formed as in FIG. 9, where the cylindrically shaped filters 115 are connected at their ends by the L-joints 116, to define a rectangular air passage 117, and two L-joints 116 located at one side are formed with air-feed tube 118 extending laterally for receiving air from the air-supply device 112. The filter means 119 is placed in the notch 114.

Further, in the clean-air injection device 111c each air-feed tube 118 passes through a rear plate 120 of the notch 114 and is connected to the air-supply passage 131. The other structures and the functions of the semiconductor-fabrication device of the invention that uses the clean-air injection device 111c are similar to the semiconductor-fabrication device of the invention that uses the clean-air injection device 111a. Thus a further description for them is omitted.

According to the semiconductor-fabrication equipment of the minienvironment system of the present invention that uses the clean-air injection device configured as discussed above, of the type to be embedded in the periphery of the opening of the loading part, when the lid 75 of the hermetic container 71 is opened into the semiconductor-fabrication equipment and a wafer 73 is taken out by the arm 93, or when a processed wafer is put in the hermetic container 71 by the arm 93, the clean air is injected form the injection slit 121 of the clean-air injection device 111 connected to the air-supply device 112 through the air-supply tube 113 or the air-supply passage 131 to form an air curtain at the gap 96 between the opening 98 and the gateway 74, to prevent the dust-entrained ambient air from passing through the gap into the hermetic container 71. Thus the dust is prevented from adhering to the wafers 73 in the hermetic containers 71. Since the clean-air injection device 111 has been previously embedded in the periphery of the opening 98 of the loading part 78, the semiconductor-fabrication device is not crenellated (i.e., flat) and has a good appearance. Further, like the clean-air injection device 1 of the type to be attached to the periphery of the opening 98, the cover 123 can be easily removed for changing the filter means 119 with a new one.

Since the present invention is configured as discussed above, when a wafer 73 is taken out of the hermetic container, or when a processed wafer is put in the hermetic container, the clean air is injected form the injection slit of the clean-air injection device connected to the air-supply device through the air-supply tube or the air-supply passage to form an air curtain at the gap between the opening of the loading part attached to the semiconductor-fabrication equipment and the gateway of the hermetic container, to prevent the dust-entrained ambient air from passing through the gap into the hermetic container. Thus the dust is prevented from adhering to the wafers in the hermetic containers 71.

The invention claimed is:

1. An air curtain forming apparatus for attachment to a semiconductor fabrication equipment, the semiconductor fabrication equipment having an opening that permits a wafer to be transferred to or from a hermetic container, the air curtain forming apparatus comprising:
   cylindrically shaped filters connected to each other, one filter having an air supply tube;
   a filter case forming a rectangular frame and encasing the cylindrically shaped filters, the filter case having a front opening and an aperture wherein the air supply tube passes through the aperture; and
   a guide cover having an injection slit and a guide slit, the guide cover removably mounted on the filter case at its front opening,
   such that air supplied to the air supply tube passes through the injection slit and is ejected from the apparatus through the guide slit forming an air curtain at a gap between the opening and a gateway of the hermetic container to prevent ambient air from entering the hermetic container when the hermetic container is opened.

2. An air-curtain forming apparatus to be attached to a semiconductor-fabrication equipment of a minienvironment system, in which system a wafer is conveyed by a wafer hermetic container to the semiconductor-fabrication equipment equipped with a wafer carrying-in opening, comprising:
   an annular case to be attached to a periphery of the wafer carrying-in opening, the case having a slit for injecting air forwardly;
   an annular air filter tube disposed in the case, the air filter tube having a circular cross section;
   an air-supply means for supplying an airflow into the annular air filter tube so that the airflow passes through the air filter tube and is injected from the slit; and
   an air-supply tube for connecting the air-supply means and the air filter tube in fluid communication,
   thereby forming an air curtain of clean air that has passed the annular air filter tube, between a periphery of an opened opening of the hermetic container and a periphery of the wafer carrying-in opening to prevent ambient air from entering the opened opening of the hermetic container when the hermetic container, which is located in front of the wafer carrying-in opening of the semiconductor fabrication device, is opened.

3. The air-curtain forming apparatus of claim 2, including a guide plate for directing the clean air that has passed the air filter tube.

4. The air-curtain forming apparatus of claim 2, wherein the air-supply tube is attached to a front panel of the semiconductor-fabrication equipment, and wherein the annular case is disposed in a notch formed in the front panel at the periphery of the wafer carrying-in opening formed in the front panel.

5. An air-curtain forming apparatus to be attached to a semiconductor-fabrication equipment of a minienvironment system, in which system a wafer is conveyed by a wafer hermetic container to the semiconductor-fabrication equipment equipped with a wafer carrying-in opening, comprising:
   an annular case to be attached to a periphery of the wafer carrying-in opening, the case having a slit for injecting air forwardly;
   an annular air filter tube disposed in the case, the air filter tube having a circular cross section;
   an air-supply means for supplying an airflow into the annular air filter tube so that the airflow passes through the air filter tube and is injected from the slit; and
   an air-supply tube for connecting the air-supply means and the air filter tube in fluid communication,
   thereby forming an air curtain of clean air that has passed the annular air filter tube, between a periphery of the wafer carrying-in opening and a periphery of an opened opening of one hermetic container located in front of the wafer carrying-in opening to prevent ambient air from entering the opening of said hermetic container when the opening of said hermetic container, is opened.

6. The air-curtain forming apparatus of claim 5, including a guide plate for directing the clean air that has passed the air filter tube.

7. The air-curtain forming apparatus of claim 5, wherein the air-supply tube is attached to a front panel of the semi-conductor-fabrication equipment, and wherein the annular case is disposed in a notch formed in the front panel at the periphery of the wafer carrying-in opening formed in the front panel.

* * * * *